(12) United States Patent
Lee et al.

(10) Patent No.: US 11,121,196 B2
(45) Date of Patent: Sep. 14, 2021

(54) DISPLAY DEVICE

(71) Applicant: Samsung Display Co., Ltd., Yongin-Si (KR)

(72) Inventors: Chang-Min Lee, Suwon-si (KR); Yujin Kang, Hwaseong-si (KR); Hyomin Ko, Suwon-si (KR); Daehyeon Kim, Hwaseong-si (KR); Juwon Lee, Cheonan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/536,428

(22) Filed: Aug. 9, 2019

(65) Prior Publication Data

US 2020/0212138 A1 Jul. 2, 2020

(30) Foreign Application Priority Data

Dec. 26, 2018 (KR) ........................ 10-2018-0169771

(51) Int. Cl.
| | |
|---|---|
| *H01L 27/32* | (2006.01) |
| *H01L 51/50* | (2006.01) |
| *H01L 51/52* | (2006.01) |
| *H01L 51/44* | (2006.01) |
| *G06K 9/00* | (2006.01) |
| *G06F 3/044* | (2006.01) |
| *H01L 51/42* | (2006.01) |

(52) U.S. Cl.
CPC ........ *H01L 27/3234* (2013.01); *G06F 3/0444* (2019.05); *G06K 9/0004* (2013.01); *G06K 9/00087* (2013.01); *H01L 27/3211* (2013.01); *H01L 51/442* (2013.01); *H01L 51/447* (2013.01); *H01L 51/5004* (2013.01); *H01L 51/5218* (2013.01); *H01L 51/5234* (2013.01); *H01L 51/5253* (2013.01); *H01L 51/424* (2013.01); *H01L 51/5056* (2013.01); *H01L 51/5072* (2013.01); *H01L 2251/552* (2013.01)

(58) Field of Classification Search
CPC . H01L 27/3234; H01L 27/288; H01L 27/323; H01L 27/3227; H01L 27/14678; H01L 2251/552; H01L 51/424; H01L 51/5056; H01L 51/5072

See application file for complete search history.

(56) References Cited

U.S. PATENT DOCUMENTS

| | | | | |
|---|---|---|---|---|
| 9,663,711 | B2 * | 5/2017 | Takeda | .................. C09K 11/06 |
| 9,961,178 | B2 | 5/2018 | Hong | |
| 2012/0061689 | A1 * | 3/2012 | Yan | .................. H01L 31/03928 257/84 |
| 2012/0286295 | A1 * | 11/2012 | Han | .................. H01L 27/3227 257/81 |
| 2017/0103248 | A1 * | 4/2017 | Yamamoto | .......... H01L 27/1462 |

(Continued)

FOREIGN PATENT DOCUMENTS

| | | |
|---|---|---|
| KR | 10-2017-0113158 A | 10/2017 |
| KR | 10-2018-0005588 A | 1/2018 |

(Continued)

*Primary Examiner* — Michael M Trinh
(74) *Attorney, Agent, or Firm* — Innovation Counsel LLP

(57) ABSTRACT

Provided is a display device including a light emitting device and a light receiving device. The light receiving device includes a first light receiving electrode and a light receiving layer. The light receiving device receives a second light reflected from an external object and generates current.

14 Claims, 17 Drawing Sheets

(56) References Cited

U.S. PATENT DOCUMENTS

2017/0358630 A1* 12/2017 Naijo ................. H01L 51/5012
2018/0012069 A1   1/2018 Chung et al.
2018/0053032 A1*  2/2018 Ding .................. G06K 9/0004
2018/0144113 A1   5/2018 Cho et al.
2018/0150671 A1   5/2018 Choo et al.

FOREIGN PATENT DOCUMENTS

KR   10-2018-0057835 A   5/2018
KR   10-2018-0061474 A   6/2018

* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2018-0169771, filed on Dec. 26, 2018, the entire contents of which are hereby incorporated by reference.

BACKGROUND

The present disclosure herein relates to a display device, and more particularly, to a display device capable of recognizing biometric information of a user.

Display devices may recognize a screen-touching finger or the like of a person through an input sensor. The methods for detecting an input through the input sensor include various methods, such as a resistive film method, an optical method, an electrostatic capacitive method, or an ultrasonic method, and among these, the electrostatic capacitive method detects whether or not an input occurs using an electrostatic capacitance variation when an input generation means touches the screen of a display device.

Recently, security for personal portable apparatuses, such as a smartphone or a tablet PC, has been a hot issue. As users use portable apparatuses more frequently, security is required for electronic commerce and the like using the portable apparatuses, and biometric information such as fingerprints is used to satisfy such requirements. In order to use such biometric information, technology for implementing a sensor or the like in a display device for recognizing biometric information is being developed.

SUMMARY

The present disclosure provides a display device including a light receiving device capable of receiving light reflected from an external object and recognizing external input information.

An embodiment of the inventive concept provides a display device including a base substrate, a light emitting device, and a light receiving device. The light emitting device and the light receiving device may be disposed on the base substrate. The light emitting device may include a first light emitting electrode and a light emitting layer. The first light emitting electrode may be disposed on the base substrate. The first light emitting layer may be disposed on the first light emitting electrode and emitting a first light. The light receiving device may include a first light receiving electrode and a light receiving layer. The first light receiving electrode may be disposed on the base substrate. The light receiving layer may be disposed on the light receiving electrode. The light receiving device may receive a second light reflected from an external object w and generate current. The external object may be a finger. The first light may be a visible light having a central wavelength of greater than or equal to about 440 nm to less than or equal to about 680 nm. The light emitting device may be an organic electroluminescent device.

In an embodiment, the light receiving layer may include a donor material and an acceptor material. The donor material may have a HOMO energy level of greater than or equal to about −6 eV to less than or equal to about −4 eV, and a LUMO energy level of greater than or equal to about −3 eV to less than or equal to about −1 eV. The acceptor material may have a HOMO energy level of greater than or equal to about −7 eV to less than or equal to about −5 eV, and a LUMO energy level of greater than or equal to about −4 eV to less than or equal to about −2 eV. The HOMO energy level of the donor material may be higher than the HOMO energy level of the acceptor material. The LUMO energy level of the donor material may be higher than the LUMO energy level of the acceptor material.

In an embodiment, the donor material may be at least one selected from among Benz [b] anthracene, 2,4-Bis[4-(N,N-dibenzylamino)-2,6-dihydroxyphenyl]squaraine, Copper (II) phthalocyanine, DBP, m-MTDATA, TDATA, 2-TNATA, NPB, TPD, TAPC, HMTPD, TCTA, PANI/DBSA, PEDOT/PSS, PANI/CSA, or PANI/PSS. The acceptor may be at least one selected from among ICBA, perylene, [5,6]-Fullerene-$C_{70}$, BCP, Bphen, Alq3, BAlq, TPBi, TAZ, NTAZ, an alkali metal complex, or an alkali earth metal complex.

In an embodiment, the light emitting device may further include a hole transport region and an electron transport region. The hole transport region may be disposed on the first light emitting electrode and the first light receiving electrode. The electron transport region may be disposed on the light emitting layer and the light receiving layer.

In an embodiment, the light receiving layer may include a donor layer and an acceptor layer. The donor layer may include the donor material. The acceptor layer may be disposed on the donor layer and include the acceptor material.

In an embodiment, the light emitting device may include a lower donor layer and an upper acceptor layer. The lower donor layer may be disposed between the first light emitting electrode and the light emitting layer, and extending from the donor layer. The upper acceptor layer may be disposed on the light emitting layer and extending from the acceptor layer.

In an embodiment, the hole transport region may be disposed between the first light emitting electrode and the lower donor layer, and between the light receiving electrode and the donor layer. The electron transport region may be disposed on the upper acceptor layer and on the acceptor layer. The light receiving layer may be a single layer.

In an embodiment, the display device may further include a second electrode, a thin film encapsulation layer, and an input sensor. The second electrode may be disposed on the light emitting layer and the light receiving layer. The thin film encapsulation layer may be disposed on the second electrode. The input sensor may be disposed on the thin film encapsulation layer. The first light emitting electrode and the light receiving electrode may be reflective electrodes, and the second electrode may be a transparent electrode.

In an embodiment, the light emitting device may include a first light emitting device, a second light emitting device, and a third light emitting device. The first light emitting device may emit a first color light, a second light emitting device may emit a second color light, and a third light emitting device may emit a third color light. The first light emitting device, the second light emitting device, and the third light emitting device may be spaced apart from each other when viewed in a plan view. The first light emitting device, the second light emitting device, the third light emitting device, and the light receiving device may be disposed on a same plane on the base substrate. The first light emitting device may include a first sub light emitting electrode, a first light emitting layer disposed on the first sub light emitting electrode and a first auxiliary layer disposed on the first light emitting layer. The second light emitting device may include a second sub light emitting electrode, a second light emitting layer disposed on the second sub light emitting electrode, and the second auxiliary layer disposed on the second light emitting layer. The third light emitting device may include a third sub light emitting electrode, a third light emitting layer disposed the third sub light emitting electrode, and the third auxiliary layer disposed on the third light emitting layer. The thickness of the third auxiliary layer may be thinner than the thickness of the second auxiliary layer and the thickness of the second auxiliary layer may be thinner than the thickness of the first auxiliary layer.

In an embodiment of the inventive concept, a display device may include a plurality of light emitting regions, a non-light emitting region, a light emitting device, and a light receiving device. The non-light emitting region may be disposed between the light emitting regions. The light emitting device may include a first light emitting electrode and a light emitting layer. The light emitting layer may be disposed on the first light emitting electrode. The light receiving device may include a first light receiving electrode and a light receiving layer. The light receiving layer may be disposed on the first light receiving electrode and may include a donor material and an acceptor material. The donor material may have a HOMO energy level of greater than or equal to about −6 eV to less than or equal to about −4 eV, and a LUMO energy level of greater than or equal to about −3 eV to less than or equal to about −1 eV. The acceptor material may have a HOMO energy level of greater than or equal to about −7 eV to less than or equal to about −5 eV, and a LUMO energy level of greater than or equal to about −4 eV to less than or equal to about −2 eV. The HOMO energy level of the donor material may be higher than the HOMO energy level of the acceptor material. The LUMO energy level of the donor material may be higher than the LUMO energy level of the acceptor material. The light receiving device may receive a second light reflected from a finger and detect a change in generated current.

In an embodiment, each of the plurality of light emitting regions may correspond to the light emitting device. The non-light emitting region may include a sensing region. The light receiving device may be disposed in the sensing region.

In an embodiment of the inventive concept, a display device may include a base substrate, a first light emitting electrode, a first light receiving electrode, a donor layer, an acceptor layer, and a light emitting layer. The first light emitting electrode and the first light receiving electrode may be disposed on the base substrate. The donor layer may be disposed on the first light emitting electrode and the first light receiving electrode, and may include a donor material having a HOMO energy level of greater than or equal to about −6 eV to less than or equal to about −4 eV and a LUMO energy level of greater than or equal to about −3 eV to less than or equal to about −1 eV. The acceptor layer may be disposed on the donor layer and may include an acceptor material having a HOMO energy level of greater than or equal to about −7 eV to less than or equal to about −5 eV and a LUMO energy level of greater than or equal to about −2 eV to less than or equal to about −4 eV. The light emitting layer may be disposed between the donor layer and the acceptor layer which overlap the first light emitting electrode. The acceptor layer overlapping the first light receiving electrode may be disposed directly on the donor layer overlapping the first light receiving electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
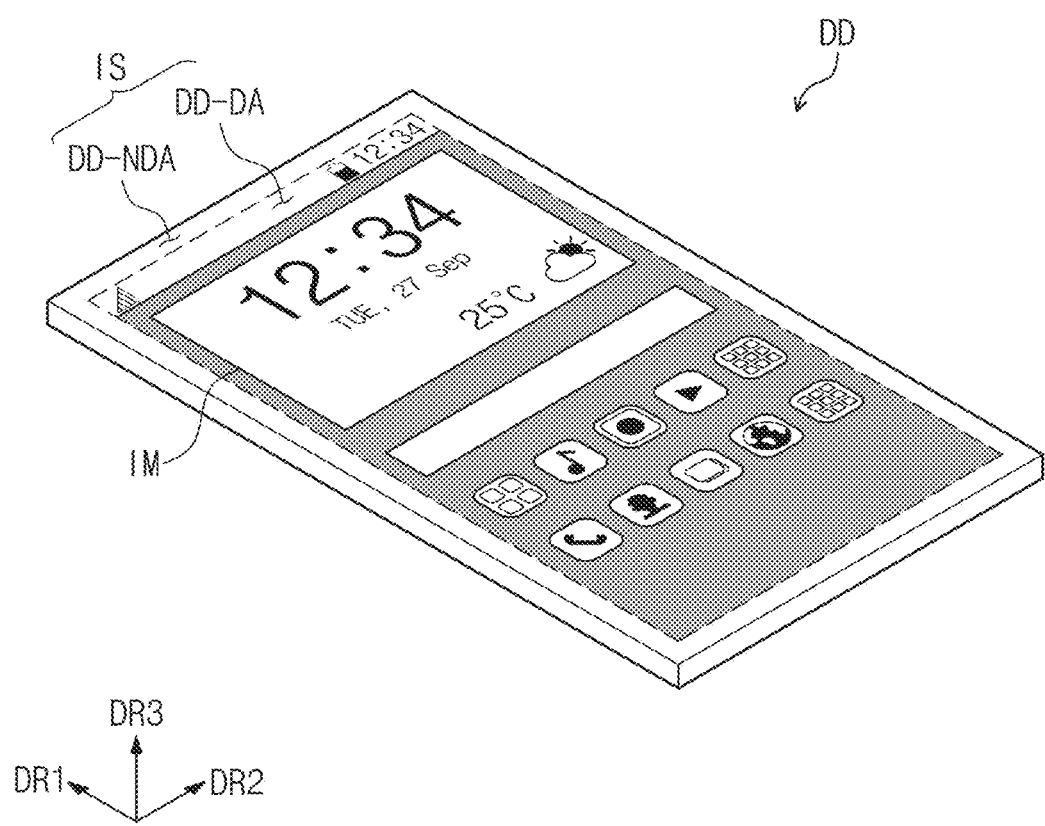
FIG. 1 is a perspective view of a display device according to an embodiment of the inventive concept.

Hereinafter, embodiments of the inventive concept will be described with reference to the accompanying drawings. In the description, it will be understood that when an element (or a region, a layer, portion, etc.) is referred to as being "on", "connected to" or "coupled to" another element or layer, it can be directly on, connected or coupled to the other element or a third intervening element may be present.

In addition, it will also be understood that when a plate is referred to as being disposed "on" another part, it can be disposed above or beneath another part."

Like reference numerals refers to like elements. Also, in the figures, the thicknesses, the ratios and the dimensions of elements are exaggerated for effective illustration of technological contents. As, used herein, the term "and/or" includes all of one or more combinations that can be defined by associated items.

It will be understood that although the terms "first" and "second" may be used herein to describe various elements, these elements should not be limited by these terms. The terms are only used to distinguish one element from other elements. For example, a first element may be referred to as a second element and the second element may similarly be referred to as the first element without departing from the scope of the present inventive concept. The terms of a singular form may include plural forms unless obviously referred to the contrary in context.

In addition, terms such as "below", "lower", "above", and "upper" may be used to describe the relationship between features illustrated in the figures. The terms have relative concept, and are described on the basis of the orientation illustrated in the figures.

It will be further understood that the terms "includes" or "has", when used in this specification, specify the presence of stated features, numbers, steps, operations, elements, components or combinations thereof, but do not preclude the presence or addition of one or more other features, integers, steps, operations, elements, components, and/or combinations thereof.

Figure 2A:
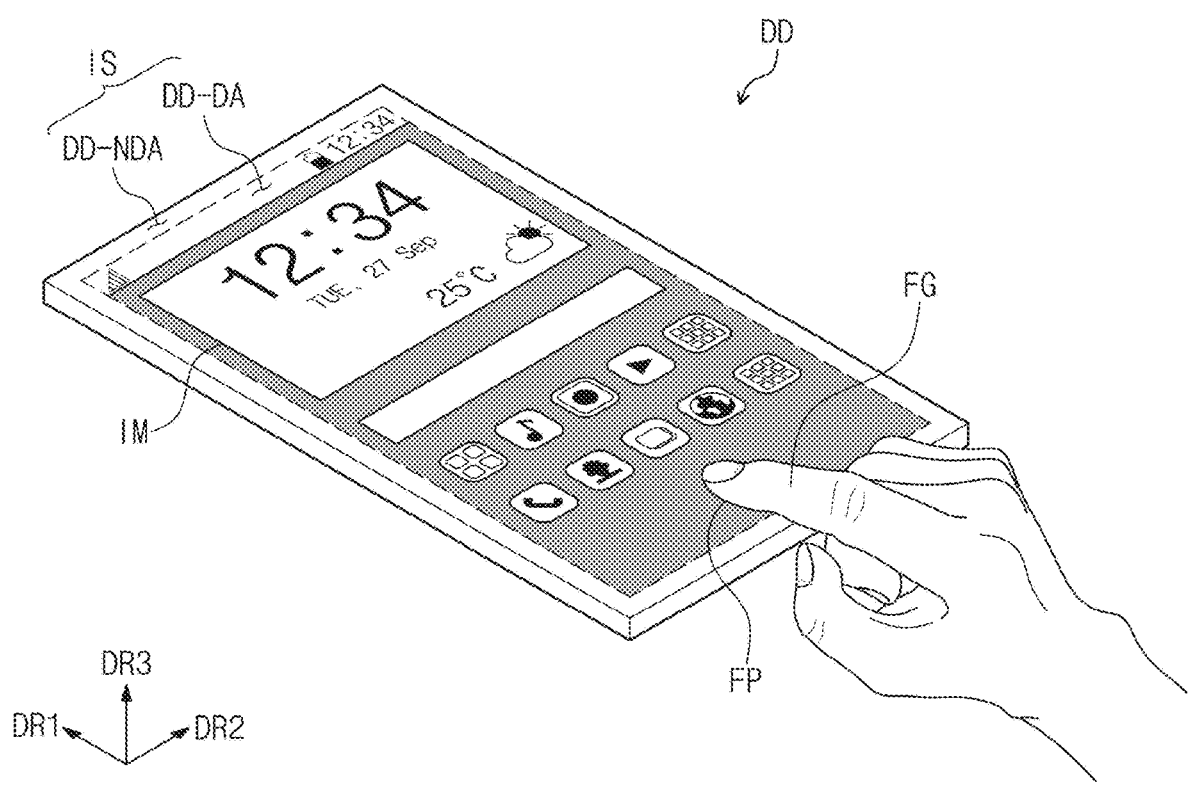
FIGS. 2A and 2B are perspective views each showing a finger of a user touching the display device shown in FIG. 1.
Figure 2B:
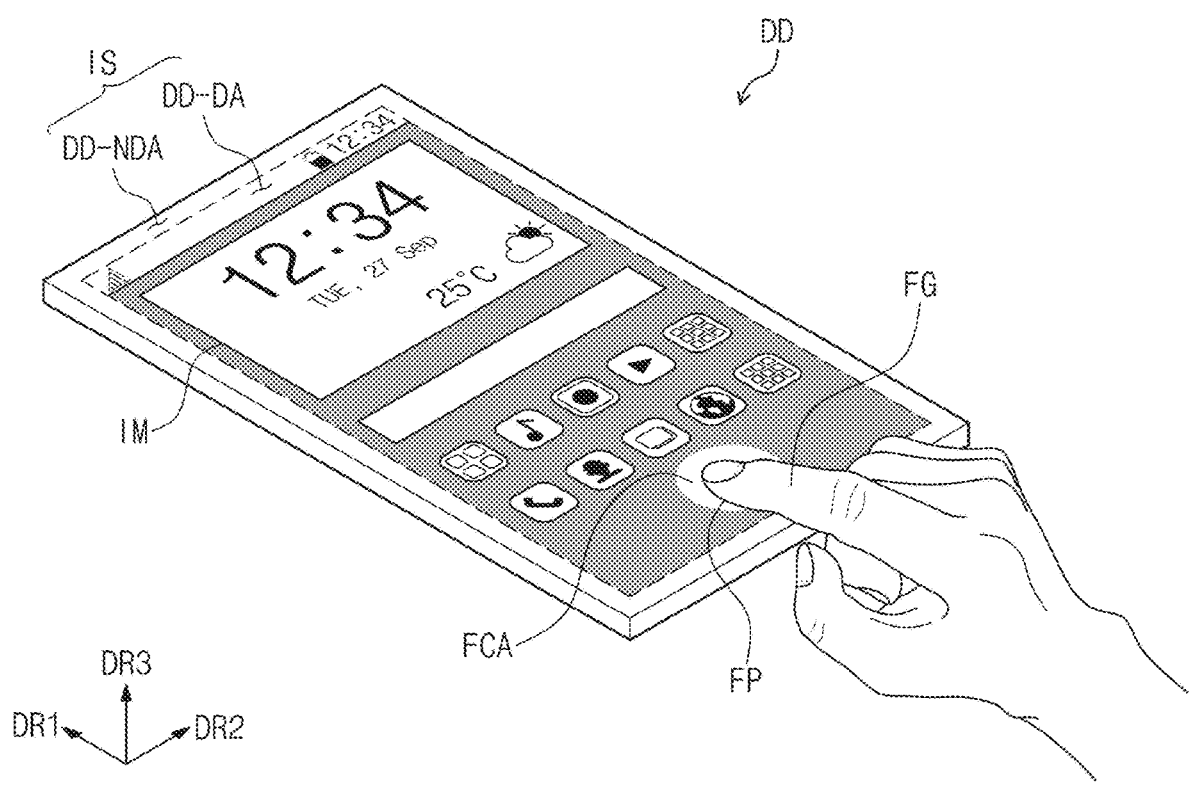

FIG. 1 is a perspective view of a display device DD according to an embodiment of the inventive concept. FIGS. 2A and 2B are perspective views each showing a finger FG of a user touching the display device DD shown in FIG. 1.

A display surface IS on which an image IM is displayed is parallel to a plane defined by a first directional axis DR1 and a second directional axis DR2. The normal direction of the display surface, that is, the thickness direction of the display device DD is indicated by a third directional axis DR3. The front surface (or upper surface) and the rear surface (or lower surface) of each of members are distinguished by the third directional axis DR3. However, the directions indicated by the first to third directional axes DR1, DR2 and DR3 have a relative concept and may be converted into other directions. Hereinafter, the first to third directions are directions, which the first to third directional axes DR1, DR2 and DR3 respectively indicate, and are referred to by the same reference symbols.

A display device DD according to an embodiment of the inventive concept may be used for a large-sized electronic device such as a television and a monitor, and a small and medium-sized electronic device such as a mobile phone, a tablet, a vehicle navigation device, a game machine, or a smart watch.

Referring to FIG. 1, the display surface IS of the display device DD may include a plurality of regions. The display surface IS includes a display region DD-DA on which an image IM is displayed and a non-display region DD-NDA adjacent to the display region DD-DA. The non-display region DD-NDA is a region in which no image is displayed. FIG. 1 shows application icons as examples of the image IM. For instance, the display region DD-DA may have a rectangular shape. The non-display region DD-NDA may surround the display region DD-DA. However, the embodiment of the inventive concept is not limited thereto, and the shapes of the display region DD-DA and the non-display region DD-NDA may be designed as needed.

Referring to FIG. 2A, the display device DD may recognize a fingerprint FP of a finger FG of a user. In an embodiment of the inventive concept, a region in which the fingerprint FP is recognized may substantially be disposed on the display region DD-DA. That is, when the fingerprint FP of the user touches the display region DD-DA, the display device DD may recognize the touch.

The display device DD may recognize the fingerprint FP of the user and determine whether or not the user is a legitimate user. In addition, the fingerprint FP of the user may be used for security of portable apparatuses, financial transactions, system controls, etc.

In an embodiment of the inventive concept, only a portion of the display region DD-DA may recognize the fingerprint FP. Meanwhile, in another embodiment, the non-display region DD-NDA which is not the display region DD-DA may recognize the fingerprint FP.

Referring to FIG. 2B, the region touched by the finger FG of a user may be defined as a fingerprint touch region FCA. As the position touched by the finger FG is changed, the position of the fingerprint touch region FCA may be changed corresponding thereto.

FIG. 2B illustrates that light is emitted from the fingerprint touch region FCA, but the embodiment of the inventive concept is not limited thereto.

The display surface IS shown in each of FIGS. 1 to 2B may be an input sensing surface for detecting whether or not an input of a user or the like is present. In addition, the display surface IS may be a fingerprint recognition surface for detecting the fingerprint of a user.

Figure 3:
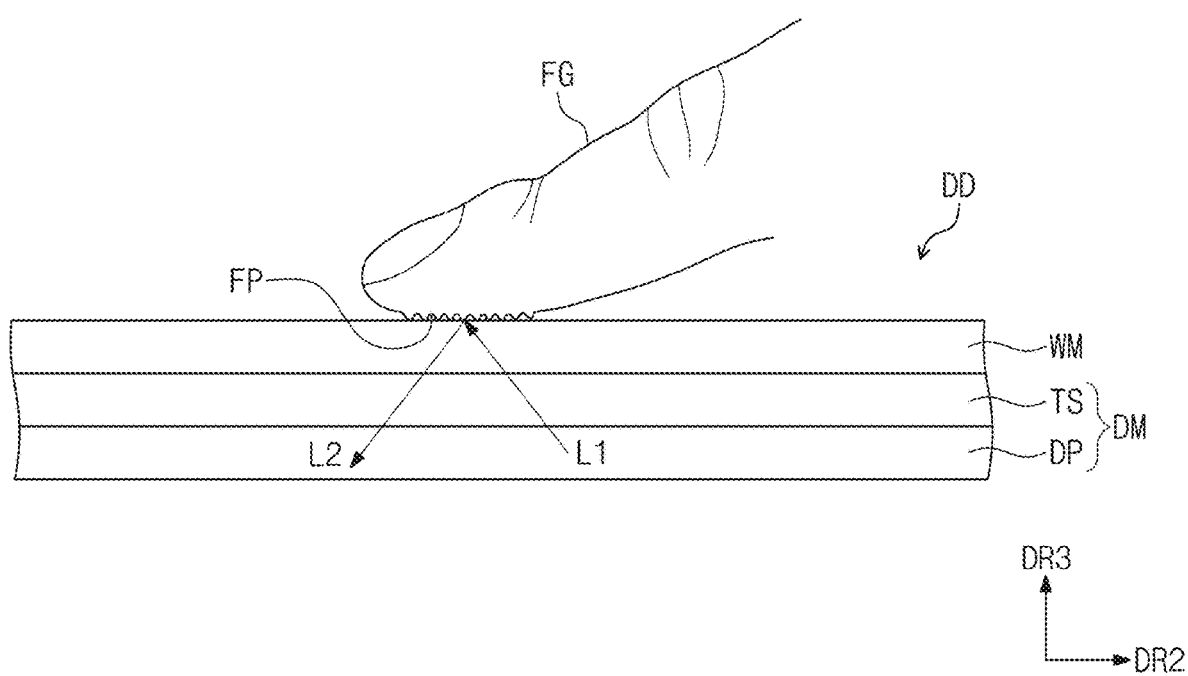
FIG. 3 shows a portion of a cross-sectional surface of the display device shown in FIG. 1.

FIG. 3 shows a portion of a cross-sectional surface of the display device DD shown in FIG. 1.

The display device DD includes a display module DM and a window WM. The window WM is disposed on the display module DM. The display device DD may further include an adhesive member (not shown). The adhesive member may bond the display module DM and the window WM.

In an embodiment, the adhesive member may be an optically clear adhesive film (OCA), an optically clear resin (OCR), or a pressure sensitive adhesive film (PSA). The adhesive of an embodiment may include at least any one of photocurable adhesive material or a thermosetting adhesive material, and composition of the material is not particularly limited.

The window WM may protect the display module DM from external shock.

In an embodiment, the display module DM may include a display panel DP and an input sensor TS.

Figure 7:
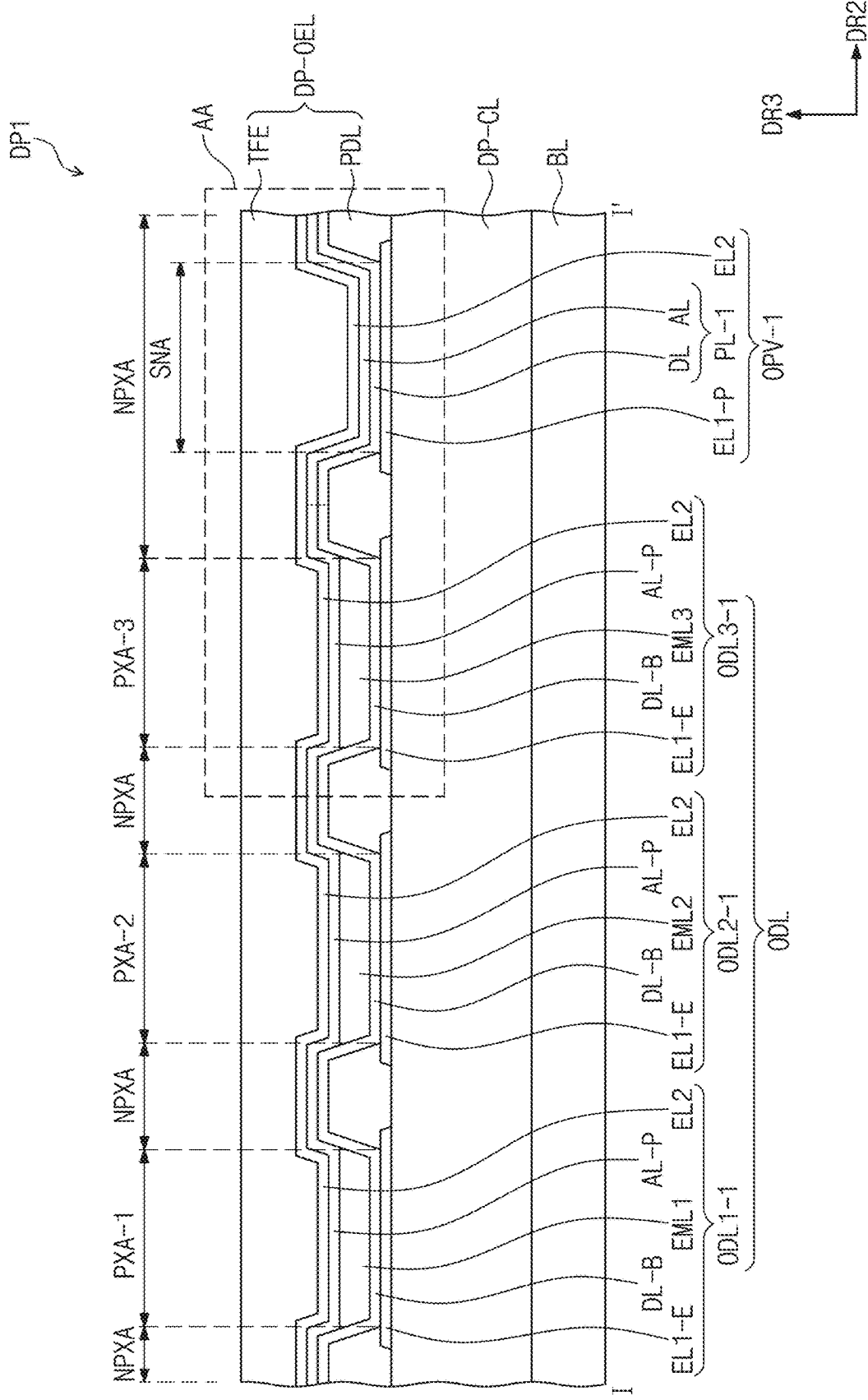
FIG. 7 is a cross-sectional view showing a cross-sectional surface taken along region I-I' of the display panel shown in FIG. 4.

The display panel DP may include a plurality of light emitting devices ODL (FIG. 7) and a plurality of light receiving devices OPV-1 (FIG. 7). The plurality of light receiving devices OPV-1 (FIG. 7) may generate current by receiving a second light L2 reflected from an external object such as a finger which received a first light L1 emitted from the plurality of light emitting devices ODL (FIG. 7). The display panel DP generates an image IM (see FIG. 1) corresponding to input image data. A process for generating a display panel DP may include a low-temperature polycrystalline silicon (LTPS) process or a low-temperature polycrystalline oxide (LTPO) process.

The input sensor TS is disposed on the display panel DP. The input sensor TS may obtain coordinate information of an external input. The input sensor TS may be disposed directly on one surface of the display panel DP. In an embodiment of the inventive concept, the input sensor TS may be manufactured together with the display panel DP through an in-situ process. However, the embodiment of the inventive concept is not limited thereto, and in another embodiment of the inventive concept, the input sensor TS may be manufactured through a separate process and be bonded to the display panel DP.

In an embodiment of the inventive concept, the input sensor TS may be a single layer type. That is, the input sensor TS may include a single conductive layer. Here, the single conductive layer means that "a conductive layer insulated by an insulating layer is one". A laminate structure of a first metal layer/a second metal layer/and a metal oxide layer corresponds to the single conductive layer, and the first metal layer/the insulating layer/and the metal oxide layer correspond to a double conductive layer. However, the embodiment of the inventive concept is not limited thereto, and the input sensor TS may be a multilayer type input sensor including a plurality of conductive layers insulated by a plurality of insulating layers.

A plurality of input sensors and a plurality of input signal lines are formed by patterning the single conductive layer. That is, the input sensors of the input sensor TS may be disposed on the same layer. The input sensors may be disposed directly on a thin film encapsulation layer TFE (see FIG. 9). In addition, a portion of each of the input signal lines may be disposed on the same layer as the input sensors.

In an embodiment of the inventive concept, the input signal lines and the input sensors may include indium tin oxide (ITO), indium zinc oxide (IZO), zinc oxide (ZnO), indium tin zinc oxide (ITZO), PEDOT, metal nanowires, or graphene. In an embodiment of the inventive concept, the input signal lines and the input sensors may include a metal layer, for example, molybdenum, silver, titanium, copper, aluminum or an alloy thereof. The input signal lines and sensors may be formed of the same material, or materials different from each other.

Although not separately shown, a display module DM according to an embodiment of the inventive concept may further include a reflection prevention layer or a protective film. The reflection prevention layer may include a color filter, a laminate structure of conductive layer/dielectric layer/conductive layer, or an optical member. The reflection layer may reduce the reflectivity of external light by absorbing, interfering destructively, or polarizing the light incident from the outside. The protective film protects the display module DM. The protective film may prevent external moisture from penetrating into the display module DM and absorb external shock.

Figure 4:
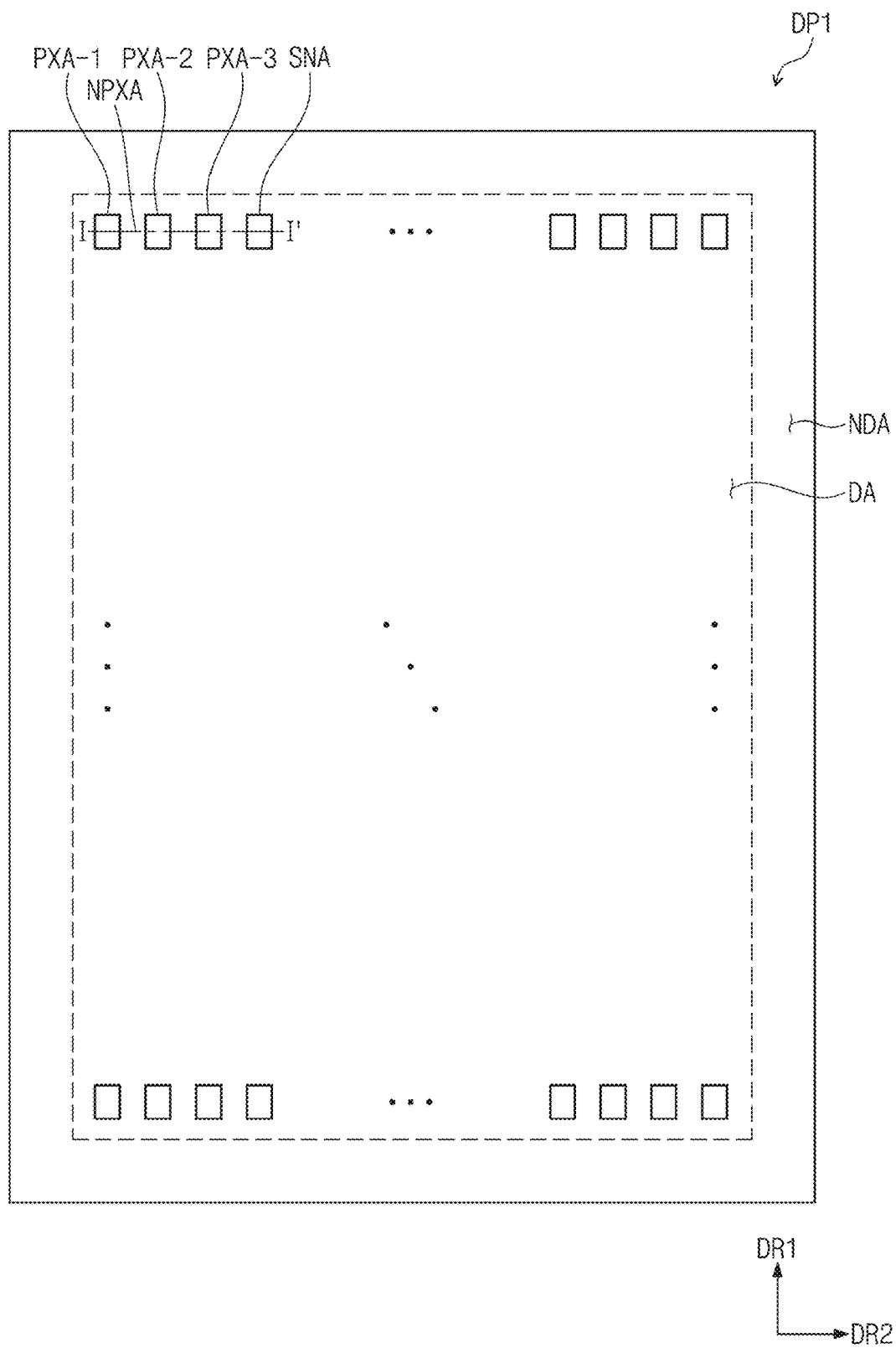
FIGS. 4, 5 and 6 are plan views of a display panel according to an embodiment of the inventive concept.
Figure 5:
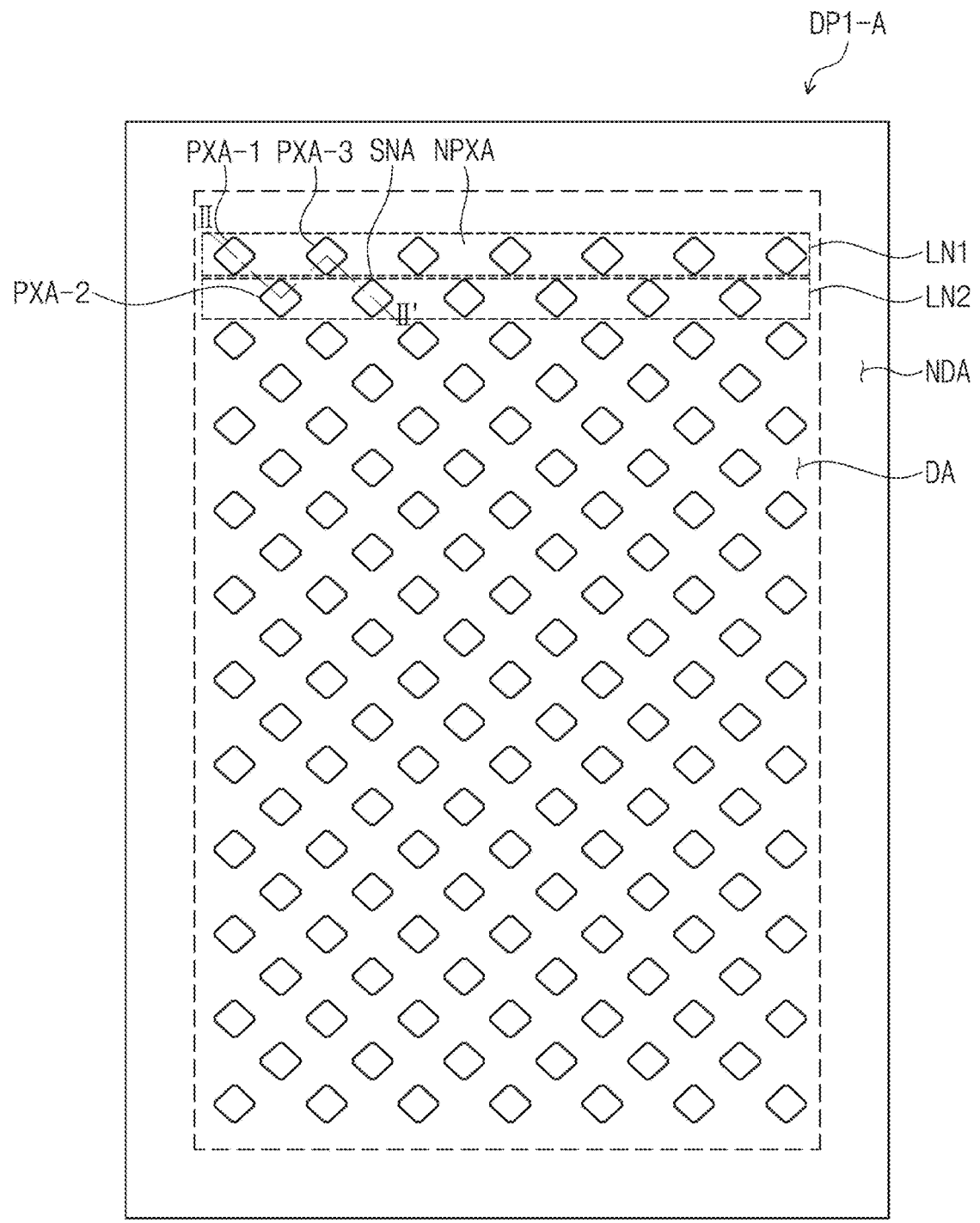
Figure 6:
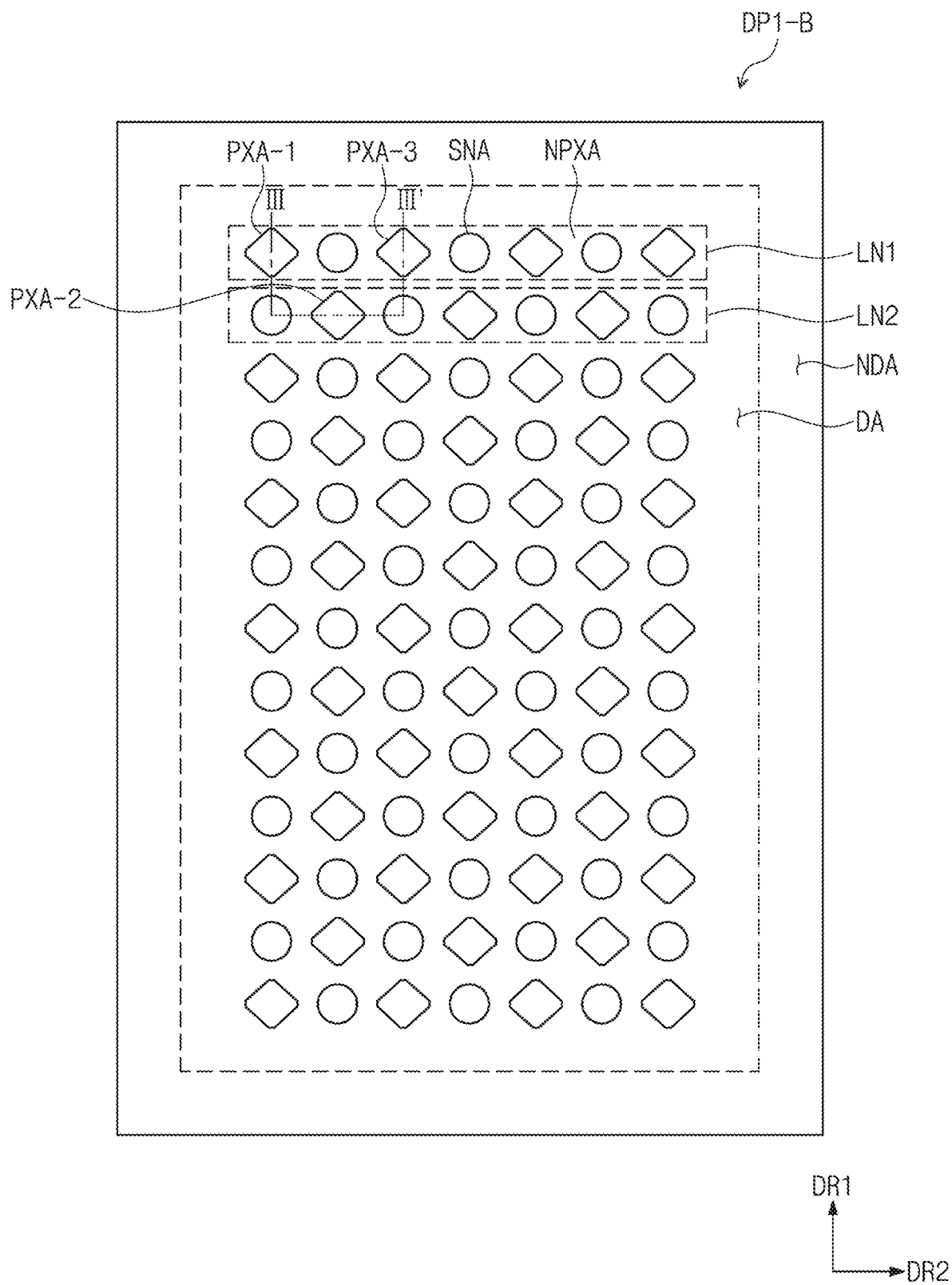

FIGS. 4 to 6 are plan views showing display panels DP1, DP1-A, and DP1-B according to an embodiment.

Referring to FIGS. 4 to 6, display panels DP1, DP1-A, and DP1-B each include light emitting regions PXA-1, PXA-2 and PXA-3, non-light emitting regions NPXA, and sensing regions SNA. The light emitting regions PXA-1, PXA-2 and PXA-3 may be regions which emit light generated in respective light emitting devices ODL1-1, ODL2-1 and ODL3-1 (FIG. 7). The areas of respective light emitting regions PXA-1, PXA-2 and PXA-3 may be different from each other, and the areas mean the area when viewed in a plan view.

Referring to FIG. 4, in the display panel DP1 according to an embodiment, the light emitting regions PXA-1, PXA-2 and PXA-3 and the sensing regions SNA may be disposed in the second directional axis DR2. In an embodiment, the first light emitting region PXA-1, the second light emitting region PXA-2, the third light emitting region PXA-3, and the sensing regions SNA may be disposed in one direction. However, the embodiment of the inventive concept is not limited thereto, and the light emitting regions PXA-1, PXA-2 and PXA-3 and the sensing regions SNA may be disposed in various orders. For example, the sensing regions SNA may be disposed between the first light emitting region PXA-1 and the second light emitting region PXA-2, or between the second light emitting region PXA-2 and the third light emitting region PXA-3. The light emitting regions PXA-1, PXA-2 and PXA-3 and the sensing regions SNA may be regularly disposed while forming a specific pattern, and the array of the pattern is not particularly limited. For example, the plurality of the light emitting regions PXA-1, PXA-2 and PXA-3 and the sensing regions SNA may be disposed as shown in FIGS. 5 and 6.

Referring to FIG. 5, in a first line LN1 of the display panel DP1-A, the first light emitting regions PXA-1 and the third light emitting region PXA-3 may be alternately disposed in the second direction DR2. In a second line LN2 spaced apart from the first line LN1 in the first direction DR1, the second light emitting regions PXA-2 and the sensing region SNA may be alternately disposed in the second direction DR2. The first line LN1 and the second line LN2 may be spaced apart from each other and alternately disposed in the first direction. At this point, the separation distance between the first line LN1 and the second line LN2 may be regular.

Referring to FIG. 6, in a first line LN1 of the display panel DP1-B, the first light emitting regions PXA-1 and the third light emitting region PXA-3 may be alternately disposed in the second direction DR2. In a second line LN2 spaced apart from the first line LN1 in the first direction DR1, the second light emitting regions PXA-2 may be disposed in one row. The sensing regions SNA may be disposed on non-light emitting regions NPXA disposed between the light emitting regions PXA-1, PXA-2 and PXA-3. For example, the sensing regions SNA may be disposed in every gap between the first light emitting regions PXA-1 and the third light emitting regions PXA-3 in the first line LN1, and between the second light emitting regions PXA-2 in the second line LN2. The first line LN1 and the second line LN2 may be spaced apart from each other and alternately disposed in the first direction DR1. The separation distance between the first line LN1 and the second line LN2 may be regular.

Referring to FIGS. 4 to 6, the arrangement of the light emitting regions PXA-1, PXA-2 and PXA-3, the non-light emitting regions NPXA, and the sensing regions SNA are described, but the embodiment of the inventive concept is not limited thereto.

In the display panels DP1, DP1-A and DP1-B shown in FIGS. 4 to 6, the light emitting regions PXA-1, PXA-2, and PXA-3 may have different areas according to colors emitted from light emitting layers EML1, EML2, and EML3 (see FIG. 7) of the light emitting devices ODL1-1, ODL2-1 and ODL3-1 (see FIG. 7). For example, in FIGS. 4 to 6, the areas of the light emitting regions PXA-1, PXA-2, PXA-3 are the same, but in the display panels DP1, DP1-A, and DP1-B of an embodiment, the blue light emitting region PXA-3 of the third light emitting device ODL-3 may have the largest area, and the green light emitting region PXA-2 of the second light emitting device ODL-2 may have the smallest area.

However, the embodiment of the inventive concept is not limited thereto, and the light emitting regions PXA-1, PXA-2, and PXA-3 may emit light of a color other than red light, green light or blue light, the light emitting regions PXA-1, PXA-2, and PXA3 may have the same area, or the light emitting regions PXA-1, PXA-2, and PXA-3 may be provided in a different area ratio than the above-described area ratio.

The area ratio of the sensing regions SNA may be the same as the area ratio of any one of the light emitting regions PXA-1, PXA-2, and PXA-3, or may have a different area ratio than the area ratio of each of the light emitting regions PXA-1, PXA-2, and PXA-3.

FIG. 7 is a cross-sectional view showing a cross-sectional surface taken along region I-I' of the display panel DP1 shown in FIG. 4.

Referring to FIGS. 3 and 7, a display device DD of an embodiment may include a base substrate BL, a light emitting device ODL disposed on the base substrate BL, and a light receiving device OPV-1 disposed on the base substrate BL.

The light emitting device ODL may include a first light emitting electrode EL1-E disposed on the base substrate BL, and light emitting layers EML1, EML2, and EML3 disposed on the first light emitting electrode EL1-E.

The light receiving device OPV-1 may include a first light receiving electrode EL1-P disposed on the base substrate BL, and a light receiving layer PL-1 disposed on the first light receiving electrode EL1-P. The light receiving device OPV-1 may generate current by receiving a second light L2 which is reflected by an external object which has received a first light L1 emitted from the light emitting device ODL.

The display panel DP1 may include a base substrate BL, a circuit layer DP-CL disposed on the base substrate BL, and an organic layer DP-OEL disposed on the circuit layer DP-CL.

The organic layer DP-OEL may include a light emitting device ODL, a light receiving device OPV-1, a pixel definition film PDL, and a thin film encapsulation layer TFE. In an embodiment, the light emitting device ODL may be an organic electroluminescent device.

The light emitting device ODL may include a first light emitting electrode EL1-E disposed on the base substrate BL on the circuit layer DP-CL, light emitting layers EML1, EML2, and EML3 disposed on the first light emitting electrode EL1-E, and a second electrode EL2 disposed on the light emitting layers EML1, EML2, and EML3.

The first light emitting electrode EL1-E has conductivity. The first light emitting electrode EL1-E may be formed of a metal alloy or a conductive compound. The first light emitting electrode EL1-E may be an anode. Furthermore, the first light emitting electrode EL1-E may be a pixel electrode which is connected to a thin film transistor (not shown) in the circuit layer DP-CL.

The first light emitting electrode EL1-E may be a transmissive electrode, a semi-transmissive electrode, or a reflective electrode. More favorably, the first light emitting electrode EL1-E may be a reflective electrode. When the first light emitting electrode EL1-E is a transmissive electrode, the first light emitting electrode EL1-E may include a transparent metal oxide, for example, indium tin oxide (ITO), indium zinc oxide (IZO), zinc oxide (ZnO), indium tin zinc oxide (ITZO), or the like.

When the first light emitting electrode EL1-E is a semi-transparent electrode or a reflective electrode, the first light emitting electrode EL1-E may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). Alternatively, the first light emitting electrode EL1-E may have a multilayer structure including a reflective film or a semi-transmissive film formed of the above-mentioned material, or a transparent conductive film formed of indium tin oxide (ITO), indium zinc oxide (IZO), zinc oxide (ZnO), indium tin zinc oxide (ITZO), or the like. For example, the first light emitting electrode EL1-E may have three-layer structure of ITO/Ag/ITO, but the embodiment of the inventive concept is not limited thereto. The thickness of the first light emitting electrode EL1-E may be about 1000 Å to about 10,000 Å, for example, about 1000 Å to about 3,000 Å.

The light emitting device ODL of an embodiment may include a plurality of light emitting devices ODL1-1, ODL2-1, and ODL3-1 which emit light having different wavelength ranges from each other. The plurality of light emitting devices ODL1-1, ODL2-1, and ODL3-1 may emit light having different colors from each other. For example, in an embodiment, the display panel DP may include a first light emitting device ODL-1 emitting red light, a second light emitting device ODL-2 emitting green light, and a third light emitting device ODL-3 emitting blue light. However, the embodiment of the inventive concept is not limited thereto, and the first to third light emitting devices ODL1-1, ODL2-1, and ODL3-1 may emit light having the same wavelength range, or at least one thereof emits light having a different wavelength range.

The light emitting layer EML may have a thickness of about 100 Å to about 1,000 Å, or, about 100 Å to about 300 Å. The light emitting layer EML may have a single layer structure formed of a single material, a single layer structure formed of a plurality of materials different from each other, or a multilayer structure formed of a plurality of layers composed of a plurality of materials different from each other.

The light-emitting layer EML may include hosts and dopants. The host material and the dopant material are not particularly limited, and a material well known in the related field may be used.

In an embodiment, the second electrode EL2 may be a common electrode or a negative electrode. The second electrode EL2 may be a transmissive electrode, a semi-transmissive electrode, or a reflective electrode. More favorably, the second electrode EL2 may be a transmissive electrode.

When the second electrode EL2 is a transmissive electrode, the second electrode EL2 may be formed of transparent metal oxide, for example, indium tin oxide (ITO), indium zinc oxide (IZO), zinc oxide (ZnO), indium tin zinc oxide (ITZO), or the like.

When the second electrode EL2 is a semi-transmissive electrode or a reflective electrode, the second electrode EL2 may be formed of Ag, Mg, Cu, Al, Pt, Pd, Au, Ni, Nd, Ir, Cr, Li, Ca, LiF/Ca, LiF/Al, Mo, Ti or a compound or a mixture of these (for example, a mixture of Ag and Mg). Alternatively, the second electrode EL2 may have a multilayer structure including a reflective film or a semi-transmissive film formed of the above-mentioned material, and a transparent conductive film formed of indium tin oxide (ITO), indium zinc oxide (IZO), zinc oxide (ZnO), indium tin zinc oxide (ITZO), or the like.

Although not shown, the second electrode EL2 may be connected to an auxiliary electrode. When the second electrode EL2 is connected to the auxiliary electrode, the resistance of the second electrode EL2 may be reduced.

The plurality of light emitting devices ODL1-1, ODL2-1, and ODL3-1 may be spaced apart from each other when viewed in a plan view. Furthermore, the plurality of light emitting devices ODL1-1, ODL2-1, and ODL3-1 may be disposed on the same plane on the base substrate BL. For example, the plurality of light emitting devices ODL1-1, ODL2-1, and ODL3-1 may be disposed on the same circuit layer DP-CL disposed on the base substrate BL. Meanwhile, the embodiment of the inventive concept is not limited thereto, and another layer may further be provided between the plurality of light emitting devices ODL1-1, ODL2-1, and ODL3-1 and the base substrate BL.

The light receiving device OPV-1 may include a first light receiving electrode EL1-P, and a light receiving layer PL-1 disposed on the first light receiving electrode EL1-P, and a second electrode EL2 disposed on the light receiving layer PL-1.

The first light receiving electrode EL1-P may be form of substantially the same material with and the same process as the first light emitting electrode EL1-E.

The light receiving layer PL-1 may include a donor layer DL, and an acceptor layer AL disposed on the donor layer DL. Here, the light receiving layer PL-1 may be formed in such a way that the donor layer DL and the acceptor layer AL come into contact with each other. That is, the light receiving layer PL-1 may include the donor layer DL disposed on the first light receiving electrode EL1-P and the acceptor layer AL disposed on the donor layer DL.

The donor layer DL may include a donor material, and the acceptor layer AL may include an acceptor material. The donor material may have a highest occupied molecular orbital (HOMO) energy level of about greater than or equal to −6 eV to about less than or equal to −4 eV, and a lowest unoccupied molecular orbital (LUMO) energy level of about greater than or equal to −3 eV to about less than or equal to −1 eV. The acceptor material may have a HOMO energy level of about greater than or equal to −7 eV to about less than or equal to −5 eV, and a LUMO energy level of about greater than or equal to −4 eV to about less than or equal to −2 eV. Here, the HOMO energy level of the donor material may be higher than the HOMO energy level of the acceptor material, and the LOMO energy level of the donor material may be higher than the LUMO energy level of the acceptor material.

The donor material may be any one selected from among Benz [b] anthracene, 2,4-Bis[4-(N,N-dibenzylamino)-2,6-dihydroxyphenyl]squaraine, Copper (II) phthalocyanine, DBP(5,10,15,20-Tetraphenylbisbenz[5,6]indeno[1,2,3-cd: 1'2',3'-lm]perylene), m-MTDATA(4,4',4"-Tris[(3-methylphenyl)phenylamino]triphenylamine), TDATA(4,4'4"-Tris(N,N-diphenylamino)triphenylamine), 2-TNATA(4,4',4"-tris{N,-(2-naphthyl)-N-phenylamino}-triphenylamine), NPB(N,N'-di(naphthalene-1-yl)-N,N'-diphenylbenzidine), TPD(N,N'-bis(3-methylphenyl)-N,N'-diphenyl-[1,1-biphenyl]-4,4'-diamine), TAPC(4,4'-Cyclohexylidene bis[N,N-bis(4-methylphenyl)benzenamine]), HMTPD(4,4'-Bis[N,N'-(3-tolyl)amino]-3,3'-dimethylbiphenyl), TCTA(4,4',4"-tris(N-carbazolyl)triphenylamine), PANI/DBSA (Polyaniline/Dodecylbenzenesulfonic acid), PEDOT/PSS (Poly(3,4-ethylenedioxythiophene)/Poly(4-styrenesulfonate)), Pani/CSA (Polyaniline/Camphor sulfonic acid), or PANI/PSS (Polyaniline/Poly(4-styrenesulfonate)).

The acceptor material may be any one selected from among ICBA(1',1'', 4',4''-Tetrahydro-di[1,4]methanonaphthaleno[1,2:2',3',56,60:2'',3''][4,5]fullerene-$C_{60}$), perylene, [5,6]-Fullerene-$C_{70}$, BCP(2,9-Dimethyl-4,7-diphenyl-1,10-phenanthroline), Bphen(4,7-Diphenyl-1,10-phenanthroline), $Alq_3$(tris(8-hydroxyquinolino)aluminum), BAlq(Bis(2-methyl-8-quinolinolato-N1,O8)-(1,1'-Biphenyl-4-olato) aluminum), TPBi(1,3,5-tris(N-phenylbenzimidazole-2-yl) benzene), TAZ(3-(4-Biphenylyl)-4-phenyl-5-tert-butylphenyl-1,2,4-triazole), NTAZ(4-(Naphthalen-1-yl)-3, 5-diphenyl-4H-1,2,4-triazole), an alkali metal complex, or an alkali earth metal complex. Meanwhile, a metal ion of the alkali metal complex may be any one selected from among a lithium ion, a sodium ion, a potassium ion, a rubidium ion, or a cesium ion, and a metal ion of the alkali earth metal complex may be any one selected from among a beryllium ion, a magnesium ion, a calcium ion, a strontium ion, or a barium ion. A ligand which is coordinate bonded and connected with a metal ion of the alkali metal complex and the alkali earth metal may be any one selected from among hydroxyquinoline, hydroxyisoquinoline, hydroxybenzoquinoline, hydroxyacridine, hydroxyphenanthridine, hydroxyphenyloxazole, hydroxyphenylthiszole, hydroxyphenyloxadiazole, hydroxydiphenythiadliazole, hydroxyphenylpyridine, hydroxyphenylbenzoimidazole, hydroxyphenylbenzothiazole, bypyridine, phenathroline, or cyclopentadiene.

Meanwhile, as donor materials, well-known materials for a hole transport region may be used aside from the above-mentioned donor material, and as acceptor materials, well-known materials for an electron transport region may be used. Accordingly, in the one embodiment shown in FIG. 7, a lower donor layer DL-B and an upper acceptor layer AL-P which overlap the light emitting device ODL in the light emitting device ODL may respectively function as a hole transport region HTR and an electron transport region ETR. Thus, the organic electroluminescent light emitting device ODL may be formed by disposing the lower donor layer DL-B and the upper acceptor layer AL-P without disposing a separate hole transport region HTR and an electron transport region ETR.

That is, the light emitting device ODL may further include: the lower donor layer DL-B which is disposed between the first light emitting electrode EL1-E and the light emitting layers EML1, EML2, and EML3 and extends from the donor layer DL of the light receiving device OPV-1; and the upper acceptor layer AL-P which is disposed on the light emitting layers EML1, EML2, and EML3 and extends from the acceptor layer AL of the light receiving device OPV-1.

In this case, the donor layer DL of the light receiving device OPV-1 and the lower donor layer DL-B of the light emitting device ODL, and the acceptor layer AL of the light receiving device OPV-1 and the upper acceptor layer AL-P of the light emitting device ODL may each be formed of a same material through a same process. Therefore, the donor layer DL and the acceptor layer AL may be deposited without a separate mask such as a fine metal mask (FMM), and thus, a process for forming the light receiving device OPV-1 may be simplified and streamlined.

Since the light receiving device OPV-1 may sense an external object as will be described later, the display panel DP1 does not require a separate sensor layer for sensing an external object. Thus, the slimming of the display device DD may be achieved.

The plurality of light emitting devices ODL1-1, ODL2-1, ODL3-1, and light receiving device OPV-1 may be spaced apart from each other when viewed in a plan view. Furthermore, the plurality of light emitting devices ODL1-1, ODL2-1, ODL3-1, and light receiving device OPV-1 may be disposed on the same plane on the base substrate BL. For example, the plurality of light emitting devices ODL1-1, ODL2-1, ODL3-1, and light receiving device OPV-1 may be disposed on the same circuit layer DP-CL which is disposed on the base substrate BL. Meanwhile, the embodiment of the inventive concept is not limited thereto, and another layer may further be provided between the plurality of light emitting devices ODL1-1, ODL2-1, ODL3-1, light receiving device OPV-1, and the base substrate BL.

The thin film encapsulation layer TFE may be disposed on the light emitting devices ODL1-1, ODL2- l and ODL3-1 and the light receiving device OPV-1. The thin film encapsulation layer TFE may be disposed on the second electrodes EL2 of the light emitting devices ODL1-1, ODL2-1 and ODL3-1 and the light receiving device OPV-1. The thin film encapsulation layer TFE may be disposed directly on the second electrode EL2 and cover the second electrode EL2.

Meanwhile, in an embodiment, a capping layer (not shown) which covers the second electrode EL2 may further be disposed. The thin film encapsulation layer TFE may directly cover the capping layer (not shown). The thin film encapsulation layer TFE may include an organic layer including an organic material and an inorganic layer including an inorganic material.

Referring to FIG. 7, the pixel definition film PDL may be disposed on the base substrate BL. The pixel definition film PDL may overlap the non-light emitting region NPXA and partially overlap the first light emitting electrode EL1-E and the first light receiving electrode EL1-P.

The pixel definition film PDL may be formed of an inorganic material. For example, the pixel definition film PDL may be formed to include silicon nitride (SiNx), silicon oxide (SiOx), silicon oxynitride (SiOxNy), or the like.

The pixel definition film PDL may be formed of an organic material such as a polymer resin. For example, the pixel definition film PDL may be formed to include a polyacrylate-based resin or a polyimide-based resin. Furthermore, the pixel definition film PDL may be formed to further include an inorganic material aside from the polymer resin. Meanwhile, the pixel definition film PDL may be formed to include a light absorbing material or include a black pigment or a black dye. However, the embodiment of the inventive concept is not limited thereto.

The pixel definition film PDL may define the light emitting regions PXA-1, PXA-2 and PXA-3. The light emitting regions PXA-1, PXA-2 and PXA-3 and the non-light emitting regions NPXA may be defined by the pixel definition film PDL.

The display panel DP-1 according to an embodiment shown in FIG. 7 may include the light emitting regions PXA-1, PXA-2 and PXA-3 and the non-light emitting regions NPXA, and a portion of the non-light emitting regions NPXA may include the sensing region SNA. Each of the light emitting regions PXA-1, PXA-2 and PXA-3, and the sensing region SNA may be regions divided by the pixel definition film PDL. The non-light emitting regions NPXA may be regions between the adjacent light emitting regions PXA-1, PXA-2 and PXA-3. The non-light emitting regions NPXA may include the sensing region SNA. Meanwhile, in this description, each of the light emitting regions PXA-1, PXA-2 and PXA-3 may correspond to the light emitting devices ODL1-1, ODL2-1 and ODL3-1, and the sensing region SNA may correspond to the light receiving device OPV-1.

FIG. 7 is described with respect to the cross-sectional surface taken along region I-I' of the display panel DP1 shown in FIG. 4, but the cross-sectional surface taken along region II-II' of the display panel DP1 shown in FIG. 5 may have substantially the same structure as that in FIG. 7, and thus, detailed content will be omitted.

Figure 8:
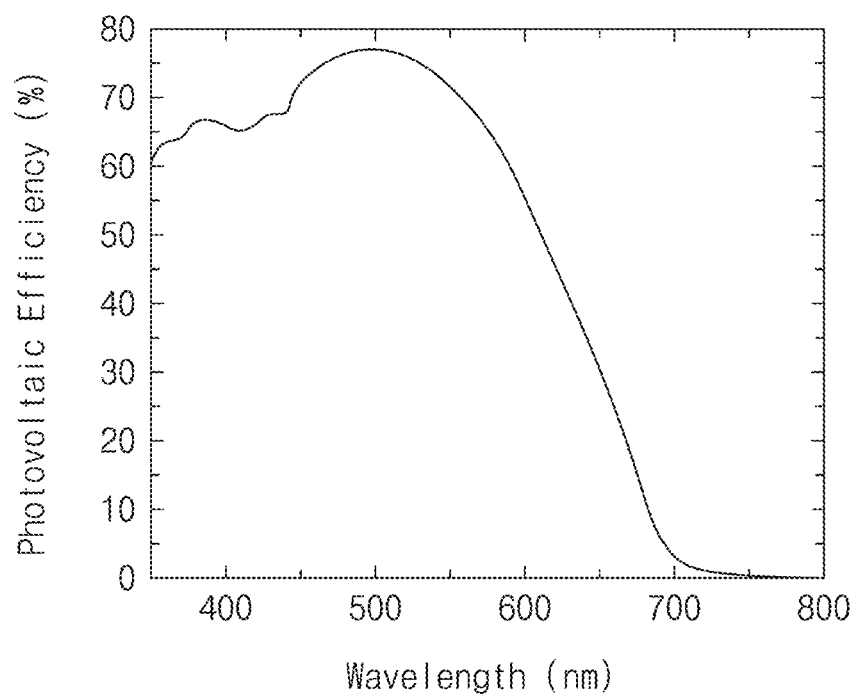
FIG. 8 is a graph showing a photovoltaic efficiency of a light receiving device according to an embodiment of the inventive concept.

FIG. 8 is a graph showing a photovoltaic efficiency according to each of the wavelength ranges of a light receiving device OPV-1. The photovoltaic efficiency indicates the ratio of energy converted into electromotive force from the energy of the absorbed light. The higher the photovoltaic efficiency, the higher the ratio by which the absorbed light energy is changed into electromotive force. Referring to the graph, the light receiving device OPV-1 has a superior photovoltaic efficiency in the visible range of about greater than or equal to 440 nm to about less than or equal to 680 nm, and thus may absorb a second light L2 in the wavelength range and easily generate current.

For example, the second light L2 may be any one of red light, green light, or blue light. However, the embodiment of the inventive concept is not limited thereto, and the second light L2 may have another color or be an infrared ray. For example, the second light L2 may be white light.

The light receiving device OPV-1 may receive light emitted only by any one of the light emitting layers EML1, EML2, or EML3, and recognize a fingerprint.

When the first light emitting layer EML1 emits red light, the second light emitting layer EML2 emits green light, and the third light emitting layer RML3 emits blue light, only the first light emitting layer EML1 may emit light thus the second light L2 may exhibit a red color, only the second light L2 emitting layer EML2 may emit light and the second light L2 may exhibit a green color, or only the third light emitting layer EML3 may emit light and the second light L2 may exhibit a blue color. When all the first to third light emitting layers EML1, EML2, and EML3 emit light, the second light L2 may exhibit a white color. Since the white light has a higher reflectivity than other color light, the recognition rate of fingerprint FP may be raised in the display device DD when recognizing the fingerprint FP using the white light.

Figure 9:
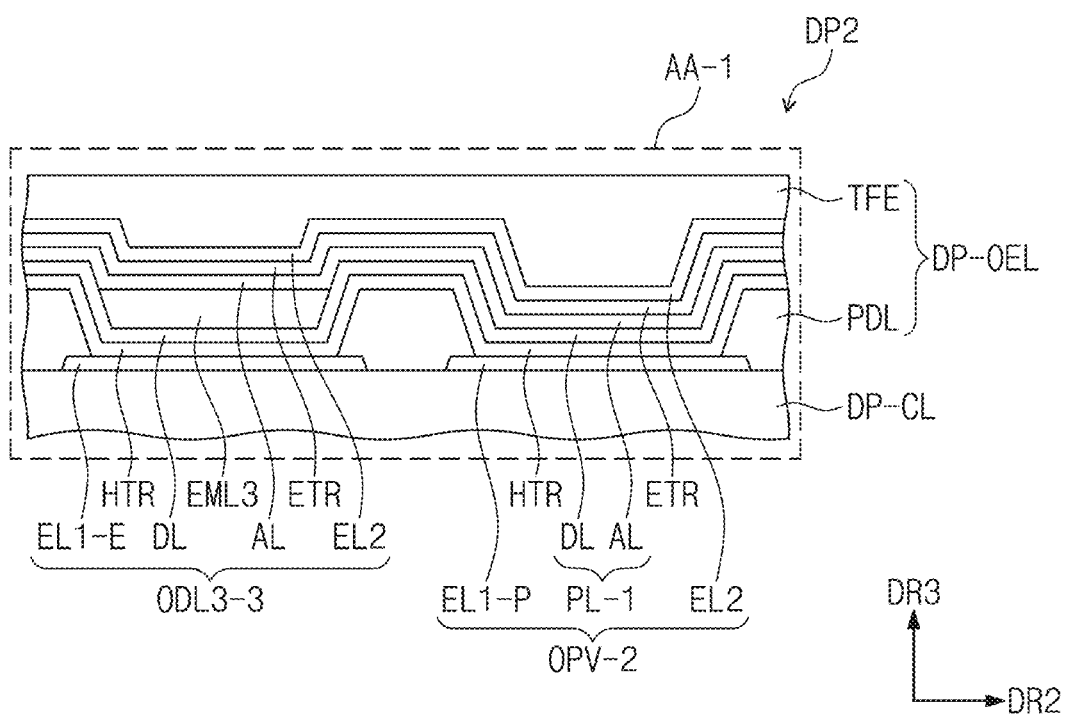
FIG. 9 is a cross-sectional view showing a portion of a display panel in an embodiment corresponding to region AA of FIG. 7.
Figure 10:
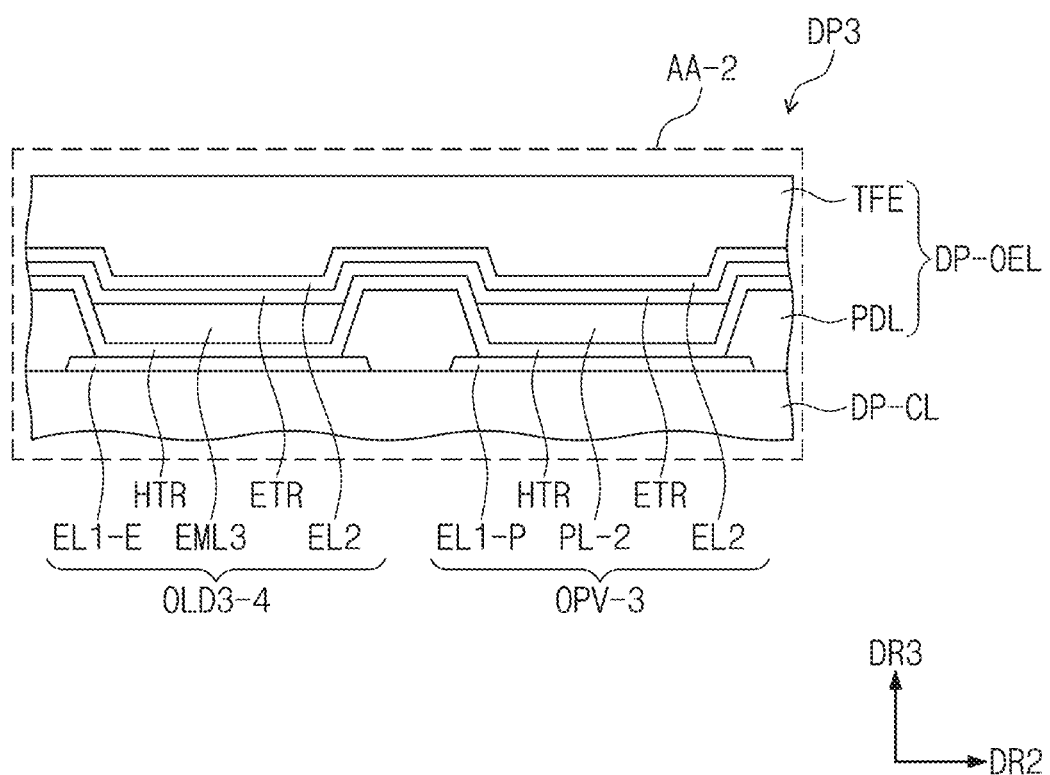
FIG. 10 is a cross-sectional view showing a portion of a display panel in an embodiment corresponding to region AA of FIG. 7.
Figure 11:
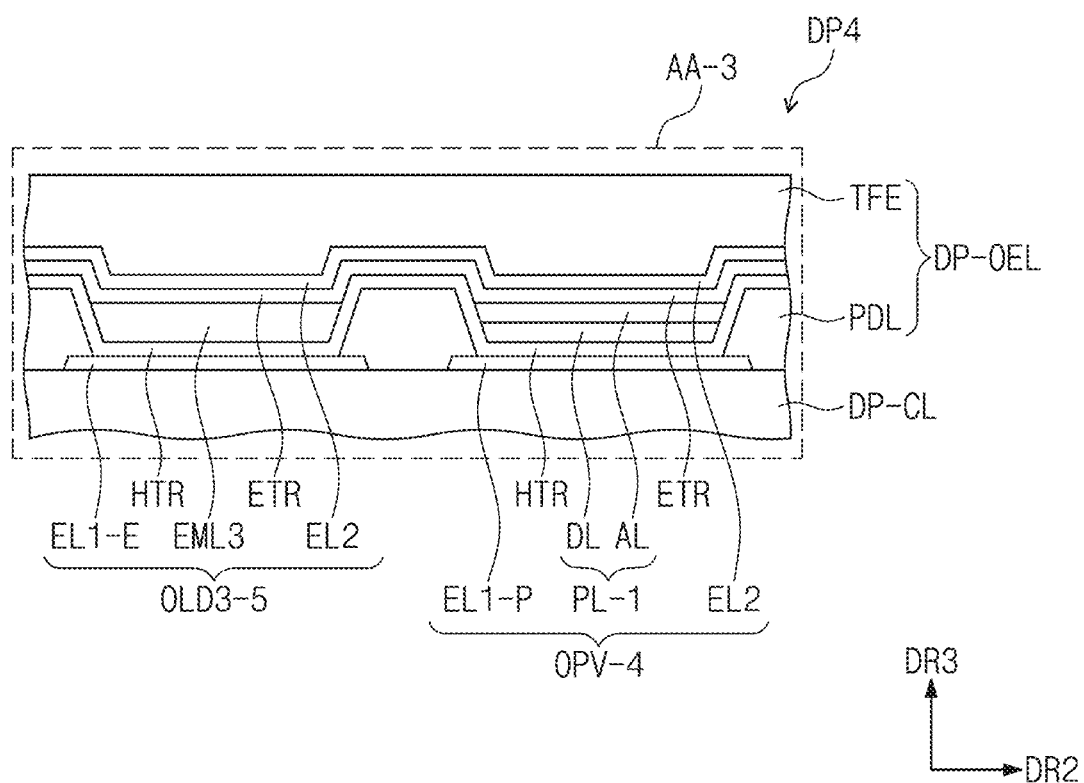
FIG. 11 is a cross-sectional view showing a portion of a display panel in an embodiment corresponding to region AA of FIG. 7.

FIGS. 9 to 11 are cross-sectional views, corresponding to region AA of FIG. 7, of display panels DP2, DP3, and DP4 according to another embodiment of the inventive concept. In FIGS. 9 to 11, since the same content as that described in FIG. 7 may be applied to the same configuration as that in FIG. 7, differences will mainly be described hereinafter.

FIG. 9 is a cross-sectional view of region AA-1 corresponding to region AA of FIG. 7 in a display panel according to another embodiment of the inventive concept.

FIG. 9 is a view showing a cross-sectional surface of a display panel DP2 according to another embodiment of the inventive concept. FIG. 9 shows a cross-sectional surface of a portion AA-1 corresponding to region AA in FIG. 7 in the display panel DP2 according to an embodiment of the inventive concept.

The display panel DP2 shown in FIG. 9 according to an embodiment of the inventive concept may further include a hole transport region HTR and an electron transport region ETR compared to the embodiment shown in FIG. 7. Referring to FIG. 9, a light emitting device ODL-3 may include a first light emitting electrode EL1-E, a hole transport region HTR, a donor layer DL, a light emitting layer EML3, an acceptor layer AL, an electron transport region ETR, and a second electrode EL2. The donor layer DL may be disposed between the hole transport region HTR and the light emitting layer EML3. The acceptor layer AL may be disposed between the light emitting layer EML3 and the electron transport region ETR.

The light receiving device OPV-2 may include a first light receiving electrode EL1-P, a hole transport region HTR, a light receiving layer PL-1, an electron transport region ETR, and a second electrode EL2. The light receiving layer PL-1 may be disposed between the hole transport region HTR and the electron transport region ETR. The light receiving layer PL-1 may include a donor layer DL, and an acceptor layer AL disposed on the donor layer DL. The donor layer DL may be disposed on the hole transport region HTR.

The hole transport region HTR may include at least any one of a hole injection layer (not shown), a hole transport layer (not shown), a hole buffer layer (not shown), or an electron barrier layer (not shown). The hole transport region HTR may include the same material as the donor material. However, the embodiment of the inventive concept is not limited thereto and the hole transport region HTR may include a widely-used material for the hole transport region HTR. For example, the hole transport region HTR may include only the well-known material for the hole transport region HTR, only the same material as the donor material, or both the well-known material for the hole transport region HTR and the same material as the donor material.

The electron transport region ETR may include at least any one of a hole barrier layer (not shown), an electron transport layer (not shown), or an electron injection layer (not shown). The electron transport region ETR may include the same material as the acceptor material. However, the embodiment of the inventive concept is not limited thereto, and the electron transport region ETR may include a widely-used material for the electron transport region ETR. For example, the electron transport region ETR may include only the well-known material for the electron transport region ETR, only the same material as the acceptor material, or both the well-known material for the electron transport region ETR and the same material as the acceptor material.

FIGS. 10 and 11 are views showing respective cross-sectional surfaces of display panels DP3 and DP4 according to embodiments of the inventive concept. FIGS. 10 and 11 show the cross-sectional surfaces of respective portions AA-2 and AA-3 corresponding to region AA of FIG. 7 in the respective display panels DP3 and DP4 according to embodiments.

The display panels DP3 and DP4 according to embodiments shown in FIGS. 10 and 11 are different from the display panel shown in FIG. 7 in that a layer containing a donor material and an acceptor material is disposed only on light receiving devices OPV-2 and OPV-3.

Referring to FIG. 10, a light emitting device ODL3-4 may include a first light emitting electrode EL1-E, a hole transport region HTR, a light emitting layer EML3, an electron transport region ETR, and a second electrode EL2. The first light emitting electrode EL1-E may be disposed on a circuit layer DP-CL, the hole transport region HTR may be disposed on the first light emitting electrode EL1-E, the light emitting layer EML3 may be disposed on the hole transport region HTR, the electron transport region ETR may be disposed on the light emitting layer EML3, and the second electrode EL2 may be disposed on the electron transport region ETR.

The light receiving device OPV-3 may include a first light receiving electrode EL1-P, a hole transport region HTR, a light receiving layer PL-2, an electron transport region ETR, and a second electrode EL2. The first light receiving electrode EL1-P may be disposed on the circuit layer DP-CL, the hole transport region HTR may be disposed on the first light receiving electrode EL1-P, the light receiving layer PL-2 may be disposed on the hole transport region HTR, the electron transport region ETR may be disposed on the light receiving layer PL-2, and the second electrode EL2 may be disposed on the electron transport region ETR.

The light receiving layer PL-2 in an embodiment may be a single layer in which a donor material and an acceptor material are mixed. When the donor material and the acceptor material are mixed and form a single layer, a contact area between the donor material and the acceptor material increases, and thus, diffusion and separation of excitons formed by a second light L2 incident onto the light receiving layer PL-2 may efficiently be generated and the photovoltaic efficiency may be increased.

In an embodiment, the hole transport region HTR and the electron transport region ETR may be disposed as common layers on the light emitting device ODL3-4 and the light receiving device OPV-3. The light receiving layer PL-2, in which the donor material and the acceptor material are mixed, may be disposed on the light receiving device OPV-3 and may not be disposed on the light emitting device ODL3-4.

The display panel DP4 shown in FIG. 11 according to an embodiment is different from that in the embodiment shown in FIG. 10 in that the light receiving layer PL-1 is not a single layer but is two layers. That is, in the embodiment of FIG. 11, a light receiving device OPV-4 may include a light receiving layer PL-1 including a donor layer DL and an acceptor layer AL, and the acceptor layer AL may be disposed directly on the donor layer DL.

FIGS. 10 and 11 disclose the light receiving layers PL-1 and PL-2 which include a single layer in which a donor material and an acceptor material are mixed, and two layers which are the donor layer DL containing a donor material and the acceptor layer AL containing an acceptor material, respectively. However, the embodiment of the inventive concept is not limited thereto, and the donor material and the acceptor material may be disposed in various shapes in the light receiving layers PL-1 and PL-2.

Figure 12:
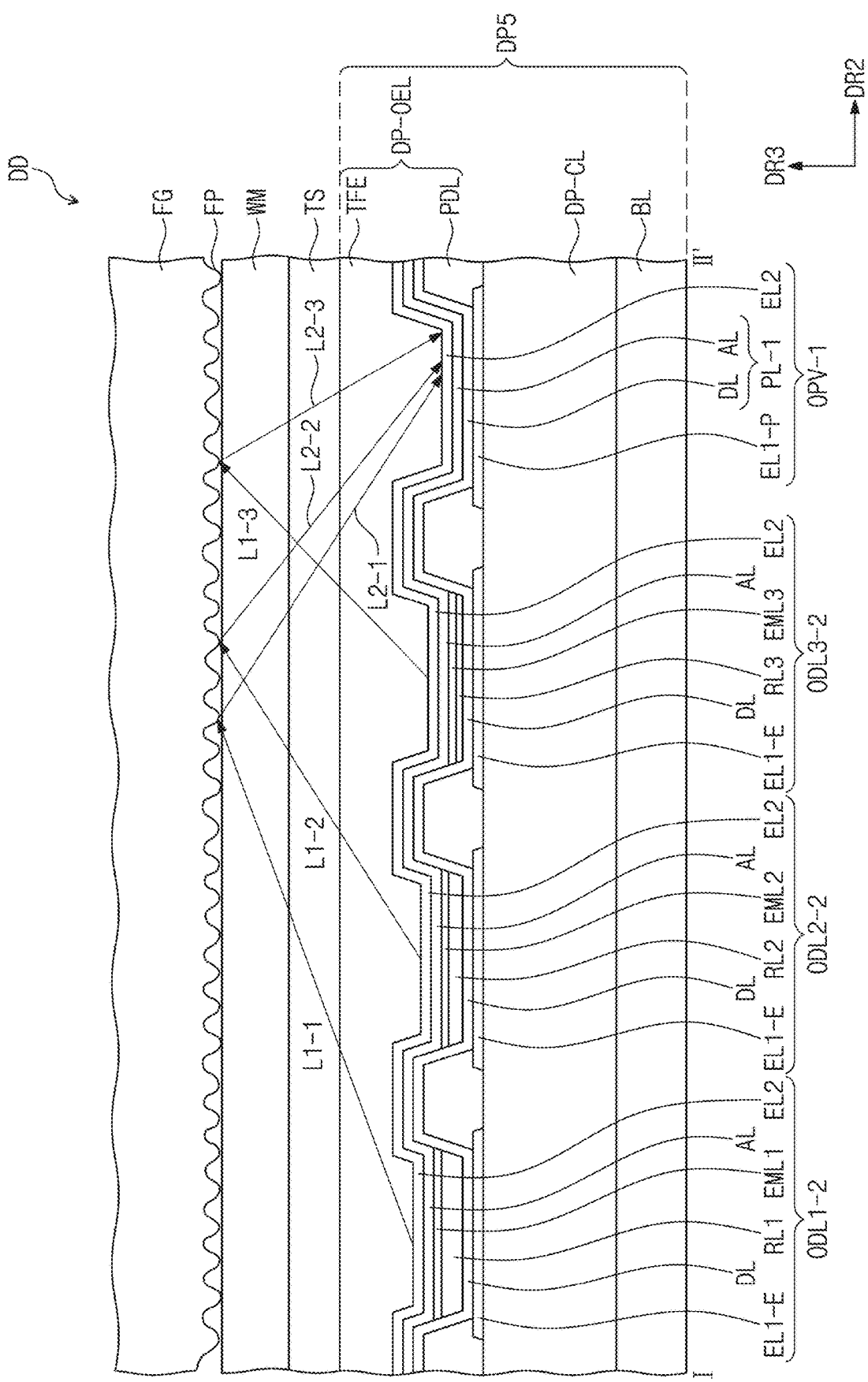
FIG. 12 shows a portion of a cross-sectional surface of the display device shown in FIG. 1.

FIG. 12 shows a portion of a cross-sectional surface of the display device shown in FIG. 3.

The display device DD may include a display panel DP5, an input sensor TS disposed on the display panel DP5, and a window WM disposed on the input sensor TS.

A first light emitting device ODL1-2 may further include a first auxiliary layer RL1. The first auxiliary layer RL1 may be disposed on a first light emitting layer EML1. That is, the first auxiliary layer RL1 may be disposed above of the first light emitting layer EML1 or the first auxiliary layer RL1 may be disposed below of the first light emitting layer EML1. The first auxiliary layer RL1 may be disposed between a donor layer DL and a first light emitting layer EML1, a second light emitting device ODL2-2 may further include a second auxiliary layer RL2. The second auxiliary layer RL2 may be disposed on a second light emitting layer EML2. That is, the second auxiliary layer RL2 may be disposed above of the second light emitting layer EML2 or the second auxiliary layer RL2 may be disposed below of the second light emitting layer EML2. The second auxiliary layer RL2 may be disposed between the donor layer DL and a second light emitting layer EML2, and a third light emitting device ODL3-2 may further include a third auxiliary layer RL3. The third auxiliary layer RL3 may be disposed on a third light emitting layer EML3. That is, the third auxiliary layer RL3 may be disposed above of the third light emitting layer EML3 or the third auxiliary layer RL3 may be disposed below of the third light emitting layer EML3. The third auxiliary layer RL3 may be disposed between the donor layer DL and a third light emitting layer EML3. Aside from this, substantially the same description as the description about the display panel DP1 described in FIG. 7 may be applied.

The presence of the auxiliary layers RL1, RL2, and RL3, the thicknesses of the auxiliary layers RL1, RL2, and RL3, and the number of the auxiliary layers RL1, RL2, and RL3 may vary according to the wavelength range of the emitted light. The auxiliary layers RL1, RL2, and RL3 may be organic layers for adjusting a resonance distance at each of the light emitting devices ODL1-2, ODL2-2 and ODL3-2. Thicknesses of the auxiliary layers RL1, RL2, and RL3 may be inversely proportional to wavelengths of light emitted from light emitting layers. For example, when the first light emitting layer EML1 emits red light, the second light emitting layer EML2 emits green light, and the third first light emitting layer EML3 emits blue light, the thickness of the third auxiliary layer RL3 may be thinner than the thickness of the second auxiliary layer RL2, and the thickness of the second auxiliary layer RL2 may be thinner than the thickness of the first auxiliary layer RL1. As described above, the thicknesses of the auxiliary layers RL1, RL2 and RL3 are adjusted, so that the resonance distance of each of the light emitting devices ODL1-2, ODL2-2 and ODL3-2 which emits color light having different central wavelengths is adjusted and the light emitting efficiency may be improved. However, the embodiment of the inventive concept is not limited thereto, and the thicknesses of the auxiliary layers RL1, RL2 and RL3 may variously be adjusted according to colors emitted by the light emitting layers EML1, EML2, and EML3.

The light emitting devices ODL1-2, ODL2-2 and ODL3-2 may emit first light L1. The light receiving device OPV-1 may generate current by receiving a second light L2 reflected from an external object. The external object may be a finger. When the donor material of a light receiving layer PL-1 receives the second light L2 (L2-1, L2-2 and L2-3) and absorbs light energy, electrons are excited, and electrons and holes are coupled to thereby form excitons. The formed excitons are diffused along the light receiving layer PL-1 and are then separated again into electrons and holes at an interface with an acceptor material. Separated electrons are transported to the second electrode EL2, holes are transported to the first light receiving electrode EL1-P, and thus, current is generated.

Figure 13:
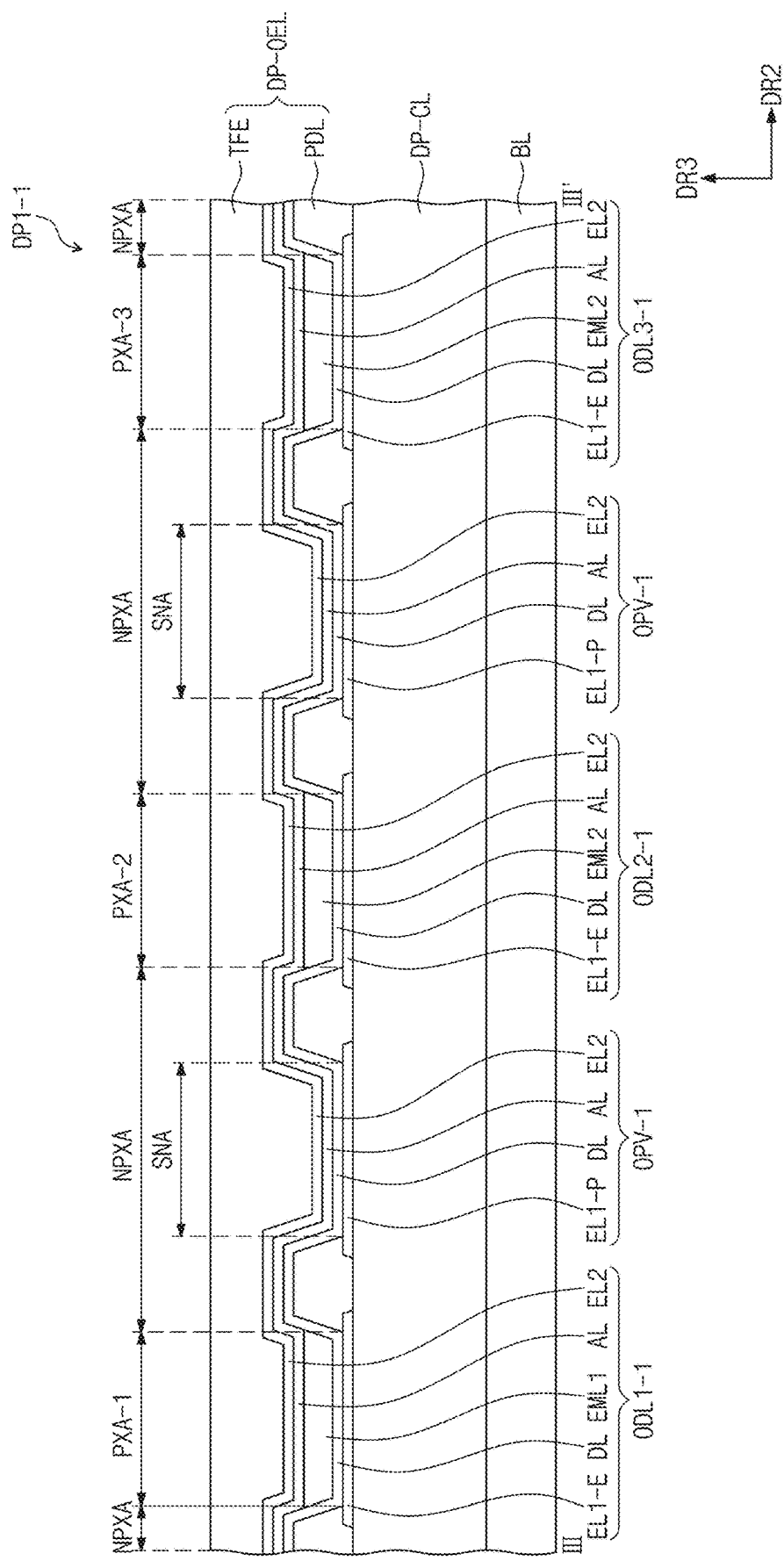
FIG. 13 is a cross-sectional view showing a cross-sectional surface taken along region III-III' of the display panel shown in FIG. 6.

FIG. 13 is a cross-sectional view showing a cross-sectional surface taken along region III-III' of the display panel shown in FIG. 6.

Referring to FIG. 13, in an organic layer DP-OEL, light emitting devices ODL1-1, ODL2-1 and ODL3-1 and a light receiving device OPV-1 are disposed in the order of the first light emitting device ODL1-1, the light receiving device OPV-1, the second light emitting device ODL2-1, the light receiving device OPV-1, and the third light emitting device ODL3-1.

Except for the above description, substantially the same content as the content described in FIGS. 7-12 may be applied. That is, a sensing region SNA may be included in a non-light emitting region NPXA, and the sensing region SNA is disposed between the light emitting regions PXA, a light emitting device ODL is disposed in a region corresponds to the light emitting region PXA, and the light receiving device OPV-1 is disposed in a region corresponds to the sensing region SNA. Thus, detailed descriptions thereon will be omitted.

Figure 14:
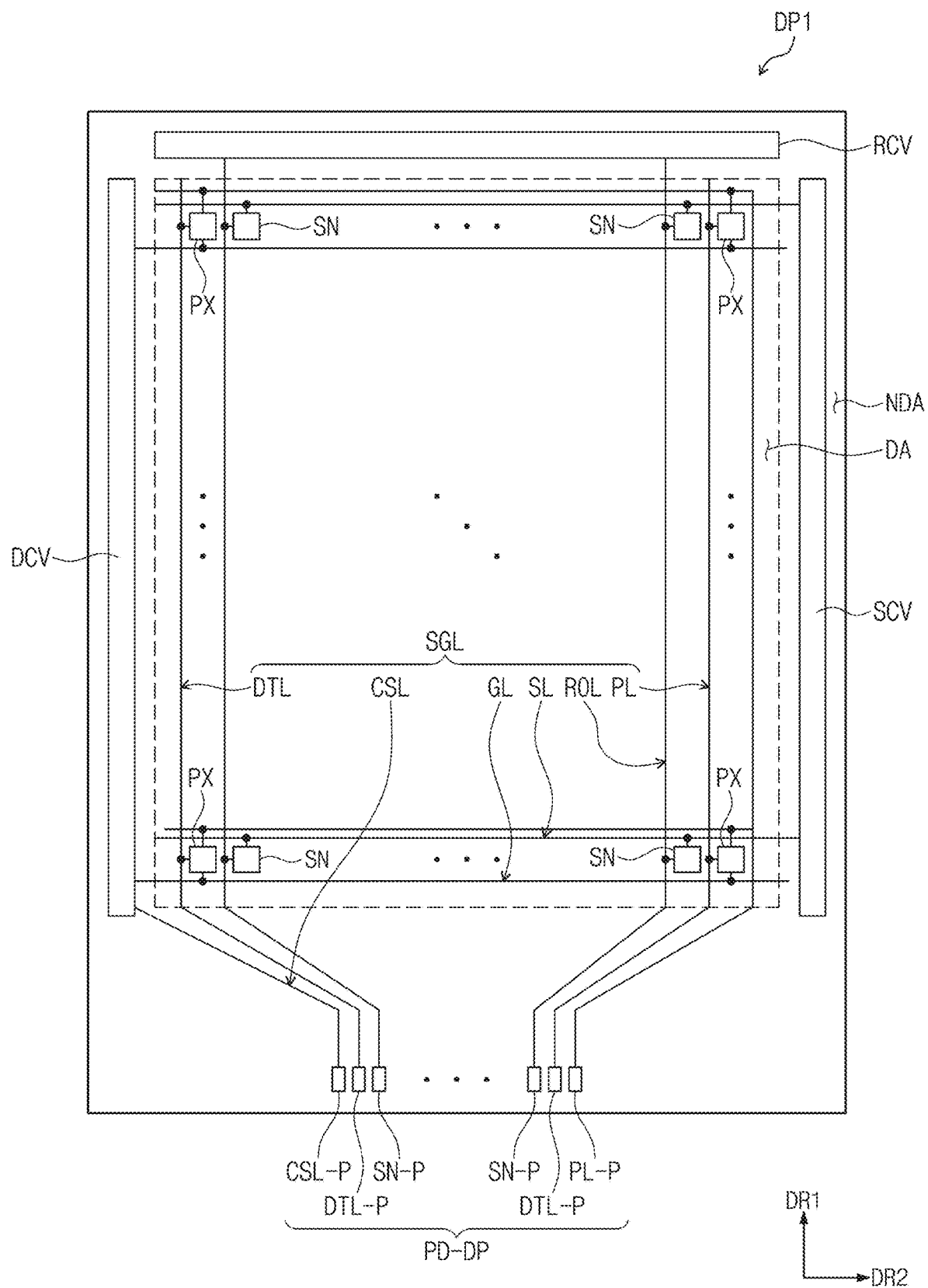
FIG. 14 is a plan view of a display panel according to an embodiment of the inventive concept.
Figure 15:
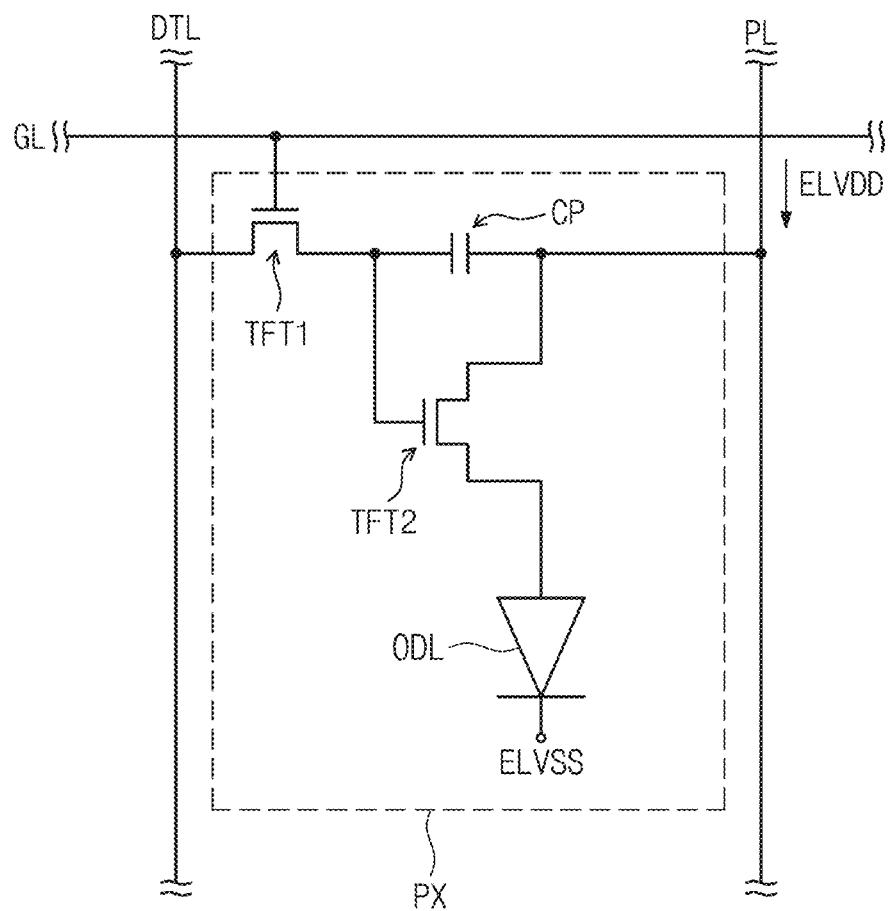
FIG. 15 is an equivalent circuit diagram of a light emitting device according to an embodiment of the inventive concept.
Figure 16:
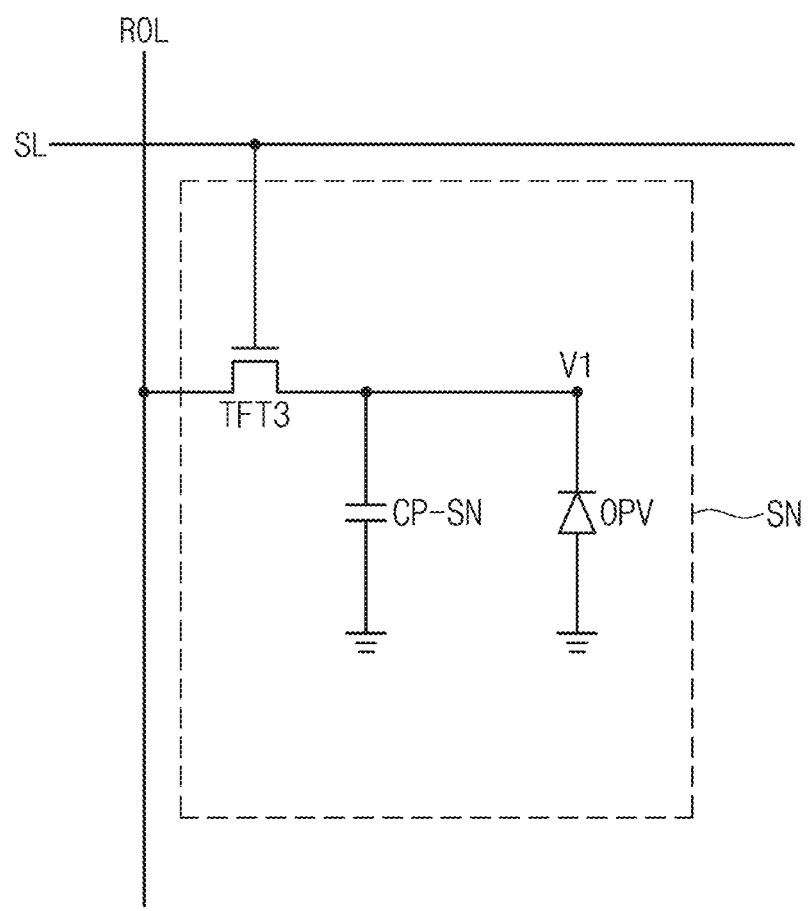
FIG. 16 is an equivalent circuit diagram of a light receiving device according to an embodiment of the inventive concept.

FIG. 14 is a plan view of a display panel DP1 according to an embodiment of the inventive concept. FIG. 15 is an equivalent circuit diagram of a pixel PX according to an embodiment of the inventive concept. FIG. 16 is an equivalent circuit diagram of a sensor SN according to an embodiment of the inventive concept.

Referring to FIG. 14, a display panel DP1 includes a display region DA and a non-display region NDA when viewed in a plan view. The display region DA and the non-display region NDA of the display panel DP1 respectively correspond to the display region DD-DA (FIG. 1) of the display device DD (FIG. 1) and the non-display region DD-NDA (FIG. 1). The display region DA and the non-display region NDA of the display panel DP1 may not necessarily be the same as the display region DD-DA and the non-display region DD-NDA of the display device DD, and may vary according to structures/designs of the display panel DP1.

The display panel DP1 includes a plurality of signal lines SGL, a plurality of pixels PX, and a plurality of sensors SN. The plurality of pixels PX and the plurality of sensors SN are disposed so as to correspond to the respective regions in which the light emitting device ODL and the light receiving device OPV-1 are disposed. In FIG. 14, pixels PX and sensors SN are illustrated to be alternately disposed, but the embodiment of the inventive concept is not limited thereto. For example, the pixels PX and the sensors SN may be disposed in the same way in which the light emitting regions PXA and the sensing regions SNA are disposed in FIGS. 4 to 6.

A region, in which the plurality of pixels PX are disposed, is defined as the display region DA. In this embodiment, the non-display region NDA may be defined along the periphery of the display region DA.

The plurality of signal lines SGL include gate lines GL, data lines DTL, a power supply line PL, a control signal line CSL, scan lines SL, and lead out lines ROL. The gate lines GL are respectively connected to the corresponding pixels among the plurality of pixels PX, and the data lines DTL are respectively connected to the corresponding pixels PX among the plurality of pixels PX. The power line PL is connected to the plurality of pixels PX. A gate drive circuit DCV to which the gate lines GL are connected may be disposed on one side of the non-display region NDA. The control signal line CSL may provide control signals to the gate drive circuit DCV.

The scan lines SL are respectively connected to the corresponding sensors SN among the plurality of sensors SN, and the lead out lines ROL are respectively connected to the corresponding sensors SN among the plurality of sensors SN. A scan drive circuit SCV to which the scan lines SL are connected may be disposed on one side of the non-display region NDA. A lead out circuit RCV to which the lead out lines ROL are connected may be disposed on one side of the non-display region NDA. In another embodiment of the inventive concept, a signal applied from an external integrated circuit may be applied to the lead out lines ROL without a lead out circuit RCV.

The separation distance between the adjacent sensors SN may be greater than or equal to about 3 μm to less than or equal to about 120 μm, and favorably, the separation distance between the adjacent sensors SN may be greater than or equal to about 20 μm to less than or equal to about 100 μm. When the separation distance between the sensors SN is greater than about 100 μm, a scan image having a sufficient resolution necessary for recognizing a fingerprint may not be obtained. When the separation distance is less than about 20 μm, a process may be complicated and an increase in manufacturing costs may occur. The separation distance in this specification may mean the shortest distance between two adjacent sensors SN.

Some of the gate lines GL. the data lines DTL, the power supply line PL, the control signal line CSL, the scan lines SL, and the lead out lines ROL are disposed on the same layer and some are disposed on different layers.

Each of the gate lines GL. the data lines DTL, the power supply line PL, the control signal line CSL, the scan lines SL, and the lead out lines ROL may include a signal line part and display panel pads PD-DP connected to ends of signal line part. The signal line part may be defined as a portion excluding the display panel pads PD-DP of each of the gate lines GL. the data lines DTL, the power supply line PL, the control signal line CSL, the scan lines SL, and the lead out lines ROL.

The display panel pads PD-DP may be formed in the same process as the transistors for driving the pixels PX and the sensors SN. For example, the display panel pads PD-DP may be formed in the same process as the transistors for driving the pixels PX and the sensors SN.

In an embodiment of the inventive concept, the display panel pads PD-DP may include a control pad CSL-P, a data pad DTL-P, a power supply pad PL-P, and a sensor pad SN-P. The gate pad part is not shown, but may be connected to the gate drive circuit DCV while overlapping the gate drive circuit DCV. Although not separately shown, a portion of the non-display region NDA, in which the control pad CSL-P, the data pad DTL-P, the power supply pad PL-P, and the sensor pad SN-P are aligned, is defined as a pad region.

FIG. 15 exemplarily illustrates a pixel PX connected to any one gate line GL, any one data line DTL, and the power supply line PL. The configuration of the pixel PX is not limited thereto, but may be modified.

The pixel PX includes a light emitting device ODL as a display device. For example, the light emitting device ODL may be a front surface light emitting type diode. The light emitting device ODL may be an organic electroluminescent device (FIG. 7). The pixel PX includes a circuit unit for driving the light emitting device ODL, and includes a first transistor TFT1 (or switching transistor), a second transistor TFT2 (or drive transistor), and a capacitor CP. The light emitting device ODL generates light in response to an electrical signal provided from the transistors TFT1 and TFT2 to the light emitting device ODL.

The first transistor TFT1 outputs a data signal applied to the data line DTL in response to a scan signal applied to the gate line GL. The capacitor CP charges a voltage corresponding to the data signal received from the first transistor TFT1.

The second transistor TFT2 is connected to the light emitting device ODL. The second transistor TFT2 controls drive current flowing through the light-emitting device ODL corresponding to an amount of charges stored in the capacitor CP. The light emitting device ODL emits light during a turn-on period of the second transistor TFT2.

The organic electroluminescent device ODL may receive the first power supply voltage ELVDD from the power supply line PL. In addition, organic electroluminescent device ODL may receive a second power supply voltage ELVSS.

FIG. 16 is an equivalent circuit diagram of a sensor SN according to an embodiment of the inventive concept.

A sensor SN may include a third transistor TFT3, a sensing capacitor CP-SN, and a light receiving device OPV.

The third transistor TFT3 is a switching device. The control electrode of the third transistor TFT3 is connected to a scan line SL, the output electrode is connected to a lead out line ROL, and the input electrode is connected to the sensing capacitor CP-SN. When the light reflected from an external object is supplied to the light receiving device OPV, the light receiving device OPV generates current. Such current flows in the direction toward the sensing capacitor CP-SN and the third transistor TFT3 due to an input voltage input to an input voltage line V1. The light receiving device OPV is one type of a photo sensor which converts light energy into electrical energy, and uses a photovoltaic effect in which current varies according to the intensity of light. When a selection signal is input to the scan line SL, the current flows through the lead out line ROL.

That is, in a display deice DD of an embodiment, a first light L1 emitted from the light emitting device ODL is reflected from an external object and the reflected first light is incident onto light receiving devices OPV1, OPV-2, OPV-3 and OPV-4 as a second light L2, and the second light L2 is received by light receiving devices OPV1, OPV-2, OPV-3 and OPV-4. Electrical energy is generated by the light received in the light receiving devices, and a change occurs in the intensity of the current flowing through the light receiving device. Thus, the light receiving device may function as a sensor which recognizes an external object.

According to an embodiment of the inventive concept, a display device capable of recognizing an external object may be provided.

According to an embodiment of the inventive concept, a display device may be provided which may be produced with a simple process and low costs.

According to an embodiment of the inventive concept, a slim display device may be provided.

So far, the inventive concept has been described in connection with preferred embodiments thereof. However, those of ordinary skill in the art will recognize that many modifications and variations are possible without departing from the spirit and scope set forth in the following claims. In addition, embodiments disclosed herein are not intended to limit the spirit and scope of the inventive concept. Rather, the appended claims and all technical idea within the range equivalent thereto should be understood to be included in the spirit and scope of the inventive concept.

What is claimed is:
1. A display device comprising:
a base substrate; and
a light emitting device and a light receiving device which are disposed on the base substrate,
wherein the light emitting device comprises:
a first light emitting electrode disposed on the base substrate, and
a light emitting layer disposed on the first light emitting electrode and emitting a first light,
wherein the light receiving device comprises:
a light receiving electrode disposed on the base substrate; and
a light receiving layer disposed on the light receiving electrode, the light receiving layer including:
a donor layer including a donor material and not overlapping the light emitting layer, and
an acceptor layer including an acceptor material and not overlapping the light emitting layer,
wherein the light receiving device receives a second light reflected from an external object and generates current, and
wherein the light emitting device and the light receiving device comprise:
a second electrode disposed on the light emitting layer and the light receiving layer,
a hole transport region disposed between the first light emitting electrode and the light emitting layer and disposed between the light receiving electrode and the donor layer, and
an electron transport region disposed between the light emitting layer and the second electrode and disposed between the acceptor layer and the second electrode.

2. The display device of claim 1, wherein the donor layer is directly contacting the acceptor layer.

3. The display device of claim 2, wherein the donor layer including the donor material having a HOMO energy level of greater than or equal to about −6 eV to less than or equal to about −4 eV and a LUMO energy level of greater than or equal to about −3 eV to less than or equal to about −1 eV;
wherein the acceptor layer including the acceptor material having a HOMO energy level of greater than or equal to about −7 eV to less than or equal to about −5 eV and a LUMO energy level of greater than or equal to about −4 eV to less than or equal to about −2 eV, and
wherein the HOMO energy level of the donor material is higher than the HOMO energy level of the acceptor material, and the LUMO energy level of the donor material is higher than the LUMO energy level of the acceptor material.

4. The display device of claim 2, wherein the donor material is at least one selected from among Benz[b]anthracene, 2,4-Bis[4-(N,N-dibenzylamino)-2,6-dihydroxyphenyl]squaraine, Copper(II) phthalocyanine, DBP, m-MTDATA, TDATA, 2-TNATA, NPB, TPD, TAPC, HMTPD, TCTA, PANI/DBSA, PEDOT/PSS, PANI/CSA, or PANI/PSS, and the acceptor is at least one selected from among ICBA, perylene, [5,6]-Fullerene-C70, BCP, Bphen, Alq3, BAlq, TPBi, TAZ, NTAZ, an alkali metal complex, or an alkali earth metal complex.

5. The display device of claim 2, further comprising:
a second electrode disposed on the light emitting layer and the light receiving layer;
a thin film encapsulation layer disposed on the second electrode; and
an input sensor disposed on the thin film encapsulation layer.

6. The display device of claim 5, wherein
the first light emitting electrode and the light receiving electrode are reflective electrodes, and
the second electrode is a transparent electrode.

7. The display device of claim 1, wherein the external object is a finger.

8. The display device of claim 1, wherein the first light is a visible light having a central wavelength of greater than or equal to about 440 nm to less than or equal to about 680 nm.

9. The display device of claim 1, wherein the light emitting device is an organic electroluminescent device.

10. The display device of claim 1, wherein the light emitting device comprises:
a first light emitting device emitting a fist color light;
a second light emitting device emitting a second color light; and
a third light emitting device emitting a third color light,
wherein the first light emitting device, the second light emitting device, the third light emitting device, and the light receiving device are spaced apart from each other when viewed in a plan view.

11. The display device of claim 10, wherein the first light emitting device, the second light emitting device, the third light emitting device, and the light receiving device are disposed on a same plane on the base substrate.

12. The display device of claim 10, wherein:
the first light emitting device comprises a first sub light emitting electrode, a first light emitting layer disposed on the first sub light emitting electrode and a first auxiliary layer disposed on the first light emitting layer;
the second light emitting device comprises a second sub light emitting electrode, a second light emitting layer disposed on the second sub light emitting electrode, and the second auxiliary layer disposed on the second light emitting layer; and
the third light emitting device comprises a third sub light emitting electrode, a third light emitting layer disposed the third sub light emitting electrode, and the third auxiliary layer disposed on the third light emitting layer,
wherein the thickness of the third auxiliary layer is thinner than the thickness of the second auxiliary layer and the thickness of the second auxiliary layer is thinner than the thickness of the first auxiliary layer.

13. The display device of claim 1, wherein the light emitting device further comprises a lower donor layer disposed between the hole transport region and the light emitting layer, and an upper acceptor layer disposed between the light emitting layer and the electron transport region.

14. The display device of claim 1, wherein the donor layer further includes a same material as a material of the hole transport region, and the acceptor layer further includes a same material as a material of the electron transport region.

* * * * *